United States Patent
Lee et al.

(10) Patent No.: US 11,158,660 B2
(45) Date of Patent: Oct. 26, 2021

(54) IMAGE SENSOR HAVING TWO-COLORED COLOR FILTERS SHARING ONE PHOTODIODE

(71) Applicants: SK hynix Inc., Icheon-si (KR); Dong-A University Research Foundation For Industry-Academy Cooperation, Busan (KR)

(72) Inventors: Kyoung-In Lee, Icheon-si (KR); Min-Su Cho, Icheon-si (KR); Sung-Wook Cho, Icheon-si (KR); Yun-Kyung Kim, Busan (KR)

(73) Assignee: SK hynix Inc., Icheon-si (KR)

( * ) Notice: Subject to any disclaimer, the term of this patent is extended or adjusted under 35 U.S.C. 154(b) by 51 days.

(21) Appl. No.: 16/540,419

(22) Filed: Aug. 14, 2019

(65) Prior Publication Data
US 2020/0135783 A1 Apr. 30, 2020

(30) Foreign Application Priority Data
Oct. 31, 2018 (KR) .......... 10-2018-0132181

(51) Int. Cl.
| H01L 33/00 | (2010.01) |
| H01L 21/00 | (2006.01) |
| H01L 27/146 | (2006.01) |
| H01L 27/32 | (2006.01) |

(52) U.S. Cl.
CPC .. *H01L 27/14621* (2013.01); *H01L 27/14627* (2013.01); *H01L 27/14643* (2013.01); *H01L 27/14645* (2013.01); *H01L 27/3227* (2013.01)

(58) Field of Classification Search
CPC ......... H01L 27/14621; H01L 27/14627; H01L 27/14643; H01L 27/14645

USPC .............. 438/69–72; 257/98, 440
See application file for complete search history.

(56) References Cited

U.S. PATENT DOCUMENTS

| 8,964,079 | B2 | 2/2015 | Fukuda et al. |
| 9,462,237 | B2 * | 10/2016 | Koshiba ............ H04N 5/35563 |
| 9,780,139 | B2 | 10/2017 | Tayanaka et al. |
| 9,813,687 | B1 | 11/2017 | Okazawa |
| 9,888,196 | B2 * | 2/2018 | Ishiwata ........... H01L 27/14643 |
| 10,734,426 | B2 * | 8/2020 | Do ..................... H01L 27/1463 |

FOREIGN PATENT DOCUMENTS

| CN | 103874952 A | 6/2014 |
| CN | 105280653 A | 1/2016 |
| CN | 107579084 A | 1/2018 |
| EP | 2690874 A1 | 1/2014 |

* cited by examiner

*Primary Examiner* — Calvin Lee
(74) *Attorney, Agent, or Firm* — Perkins Coie LLP

(57) ABSTRACT

Disclosed is an image sensor having a plurality of groups of pixels, each group of pixels including: first to third image detection color filter sets and a phase difference detection color filter set, which are arranged in a matrix with rows and columns. The phase difference detection color filter set comprises first to fourth phase difference detection color filter pairs arranged in a matrix with rows and columns. The first to fourth phase difference detection color filter pairs comprise first to fourth left phase difference detection color filters positioned on the left of each of the first to fourth phase difference detection color filter pairs and first to fourth right phase difference detection color filters positioned on the right of each of the first to fourth phase difference detection color filter pairs, respectively.

18 Claims, 20 Drawing Sheets

FIG. 8

| CF1<br>(G) | CF4<br>(B) |
|---|---|
| CF2<br>(R) | CF3<br>(G) |
| CF1<br>(G) — PCF2L (G) \| PCF2R (R/B) \| PCF1L (R/B) \| PCF1R (G) | PCF3L (G) \| PCF3R (B/R) \| PCF4L (B/R) \| PCF4R (G) |
| CF2<br>(R) | CF3<br>(G) |

IMAGE SENSOR HAVING TWO-COLORED COLOR FILTERS SHARING ONE PHOTODIODE

CROSS-REFERENCE TO RELATED APPLICATION

This patent document claims the priority and benefits of Korean Patent Application No. 10-2018-0132181 filed on Oct. 31, 2018, which is incorporated herein by reference in its entirety.

TECHNICAL FIELD

Exemplary embodiments provide an image sensor, and more particularly to a pixel layout of an image sensor.

BACKGROUND

Recently, with the development of information and communication technologies and the digitalization of image information, an increasing number of electrical devices, such as a digital camera, camcorder, personal communication system (PCS), game machine, security camera and medical micro-camera, are now equipped with image sensors. The image sensor is manufactured to have an auto-focus function that allows the image sensor to analyze the phase of light incident at various angles to automatically adjust a focus. Typically, a photodiode is at least partially covered by an optically opaque pattern, for the sake of the auto-focus function. Thus, a decrease in the amount of light received by the photodiode may impact the sensitivity and performance of the auto-focus function.

SUMMARY

This patent document provides, among others, designs of an image sensor that includes two-colored color filters sharing one photodiode to implement an auto-focus function, thereby having improved light sensitivity and an enhanced auto-focus function.

Also, this patent document provides an image sensor in which two-colored color filters share one photodiode, increasing an absorption ratio while improving a process margin.

In an embodiment, an image sensor having a plurality of groups of pixels, each group of pixels may include first to third image detection color filter sets and a phase difference detection color filter set, which are arranged in a matrix with rows and columns. The phase difference detection color filter set comprises first to fourth phase difference detection color filter pairs arranged in a matrix with rows and columns. The first to fourth phase difference detection color filter pairs comprise first to fourth left phase difference detection color filters positioned on the left of each of the first to fourth phase difference detection color filter pairs and first to fourth right phase difference detection color filters positioned on the right of each of the first to fourth phase difference detection color filter pairs, respectively.

The first to fourth left phase difference detection color filters may include two green color filters, one blue color filter and one red color filter.

The first to fourth right phase difference detection color filters may include two green color filters, one blue color filter and one red color filter.

The image sensor may further include first to third image detection photodiode sets overlapping the first to third image detection color filter sets, respectively; and a phase difference detection photodiode set overlapping the phase difference detection color filter set. The first image detection photodiode set comprises four first unit image detection photodiodes, the second image detection photodiode set comprises four second unit image detection photodiodes, and the third image detection photodiode set comprises four third unit image detection photodiodes.

The phase difference detection photodiode set may include first to fourth phase difference detection photodiodes arranged in a matrix with rows and columns, and the first to fourth phase difference detection color filter pairs overlap the first to fourth phase difference detection photodiodes, respectively.

The first left phase difference detection color filter and the first right phase difference detection color filter may share the first phase difference detection photodiode, the second left phase difference detection color filter and the second right phase difference detection color filter may share the second phase difference detection photodiode, the third left phase difference detection color filter and the third right phase difference detection color filter may share the third phase difference detection photodiode, and the fourth left phase difference detection color filter and the fourth right phase difference detection color filter share the fourth phase difference detection photodiode.

Each of the first to third image detection color filter sets may include one merged color filter. The first unit image detection photodiodes of the first image detection photodiode set may share the merged color filter of the first image detection color filter set. The second unit image detection photodiodes of the second image detection photodiode set may share the merged color filter of the second image detection color filter set. The third unit image detection photodiodes of the third image detection photodiode set may share the merged color filter of the third image detection color filter set.

The image sensor may further include first to third image detection micro-lens sets overlapping the first to third image detection color filter sets, respectively; and a phase difference detection micro-lens set overlapping the phase difference detection color filter set. The first image detection micro-lens set may include four first unit image detection micro-lenses. The second image detection micro-lens set may include four second unit image detection micro-lenses. The third image detection micro-lens set may include four third unit image detection micro-lenses.

The phase difference detection micro-lens set may include first to fourth phase difference detection micro-lenses arranged in a matrix with rows and columns, and the first to fourth phase difference detection color filter pairs overlap the first to fourth phase difference detection micro-lenses, respectively.

The first left phase difference detection color filter and the first right phase difference detection color filter may share the first phase difference detection micro-lens. The second left phase difference detection color filter and the second right phase difference detection color filter may share the second phase difference detection micro-lens. The third left phase difference detection color filter and the third right phase difference detection color filter share the third phase difference detection micro-lens. The fourth left phase difference detection color filter and the fourth right phase difference detection color filter share the fourth phase difference detection micro-lens.

In an embodiment, an image sensor may include first to third image detection color filter sets and a phase difference detection color filter set which are arranged in a matrix with rows and columns; and first to third image detection photodiode sets and a phase difference detection photodiode set, which overlap the first to third image detection color filter sets and the phase difference detection color filter set, respectively, wherein the phase difference detection color filter set comprises: a first phase difference detection color filter pair having a first left phase difference detection color filter and a first right phase difference detection color filter; a second phase difference detection color filter pair having a second left phase difference detection color filter and a second right phase difference detection color filter; a third phase difference detection color filter pair having a third left phase difference detection color filter and a third right phase difference detection color filter; and a fourth phase difference detection color filter pair having a fourth left phase difference detection color filter and a fourth right phase difference detection color filter, wherein the first left phase difference detection color filter and the first right phase difference detection color filter have different colors, the second left phase difference detection color filter and the second right phase difference detection color filter have different colors, the third left phase difference detection color filter and the third right phase difference detection color filter have different colors, and the fourth left phase difference detection color filter and the fourth right phase difference detection color filter have different colors.

The first phase difference detection color filter pair and the second phase difference detection color filter pair may be adjacent to each other in a first direction, the third phase difference detection color filter pair and the fourth phase difference detection color filter pair are adjacent to each other in the first direction, the first phase difference detection color filter pair and the fourth phase difference detection color filter pair are adjacent to each other in a second direction perpendicular to the first direction, and the second phase difference detection color filter pair and the third phase difference detection color filter pair are adjacent to each other in the second direction.

The first left phase difference detection color filter and the second right phase difference detection color filter may have the same color.

The third right phase difference detection color filter and the fourth left phase difference detection color filter may have the same color.

The first left phase difference detection color filter and the fourth right phase difference detection color filter may have the same color.

The second left phase difference detection color filter, the third left phase difference detection color filter, and the third image detection color filter set adjacent thereto may have the same color.

In another embodiment, an image sensor may include first to fourth phase difference detection photodiodes arranged in a matrix with rows and columns; a first left phase difference detection color filter and a first right phase difference detection color filter which overlap the first phase difference detection photodiode; a second left phase difference detection color filter and a second right phase difference detection color filter which overlap the second phase difference detection photodiode; a third left phase difference detection color filter and a third right phase difference detection color filter which overlap the third phase difference detection photodiode; and a fourth left phase difference detection color filter and a fourth right phase difference detection color filter which overlap the fourth phase difference detection photodiode.

The first left phase difference detection color filter and the first right phase difference detection color filter may have different colors, the second left phase difference detection color filter and the second right phase difference detection color filter have different colors, the third left phase difference detection color filter and the third right phase difference detection color filter have different colors, and the fourth left phase difference detection color filter and the fourth right phase difference detection color filter have different colors.

One of the first to fourth left phase difference detection color filters and one of the first to fourth right phase difference detection color filters may transmit a first color, one of the first to fourth left phase difference detection color filters and one of the first to fourth right phase difference detection color filters transmit a second color, one of the first to fourth left phase difference detection color filters and one of the first to fourth right phase difference detection color filters transmit a third color, and one of the first to fourth left phase difference detection color filters and one of the first to fourth right phase difference detection color filters transmit a fourth color.

The image sensor may further include a first phase difference detection micro-lens overlapping the first left phase difference detection color filter and the first right phase difference detection color filter such that the first left phase difference detection color filter and the first right phase difference detection color filter share the first phase difference detection micro-lens; a second phase difference detection micro-lens overlapping the second left phase difference detection color filter and the second right phase difference detection color filter such that the second left phase difference detection color filter and the second right phase difference detection color filter share the second phase difference detection micro-lens; a third phase difference detection micro-lens overlapping the third left phase difference detection color filter and the third right phase difference detection color filter such that the third left phase difference detection color filter and the third right phase difference detection color filter share the third phase difference detection micro-lens; and a fourth phase difference detection micro-lens overlapping the fourth left phase difference detection color filter and the fourth right phase difference detection color filter such that the fourth left phase difference detection color filter and the fourth right phase difference detection color filter share the fourth phase difference detection micro-lens.

In another embodiment, an image sensor may include first to third non-phase difference detection color filter sets and a phase difference detection color filter set which are arranged in a matrix shape. The phase difference detection color filter set may include first to fourth phase difference detection color filter pairs arranged in a matrix shape. The first to fourth phase difference detection color filter pairs may include first to fourth left phase difference detection color filters positioned on the left and first to fourth right phase difference detection color filters positioned on the right, respectively.

In another embodiment, an image sensor may include: first to third non-phase difference detection color filter sets and a phase difference detection color filter set which are arranged in a matrix shape; and first to third non-phase difference detection photodiode sets and a phase difference detection photodiode set, which overlap the first to third non-phase difference detection color filter sets and the phase difference detection color filter set, respectively. The phase difference detection color filter set may include: a first phase difference detection color filter pair having a first left phase difference detection color filter and a first right phase difference detection color filter; a second phase difference detection color filter pair having a second left phase difference detection color filter and a second right phase difference detection color filter; a third phase difference detection color filter pair having a third left phase difference detection color filter and a third right phase difference detection color filter; and a fourth phase difference detection color filter pair having a fourth left phase difference detection color filter and a fourth right phase difference detection color filter.

In another embodiment, an image sensor may include: first to fourth phase difference detection photodiodes arranged in a matrix shape; a first left phase difference detection color filter and a first right phase difference detection color filter which overlap the first phase difference detection photodiode; a second left phase difference detection color filter and a second right phase difference detection color filter which overlap the second phase difference detection photodiode; a third left phase difference detection color filter and a third right phase difference detection color filter which overlap the third phase difference detection photodiode; and a fourth left phase difference detection color filter and a fourth right phase difference detection color filter which overlap the fourth phase difference detection photodiode.

BRIEF DESCRIPTION OF THE DRAWINGS

FIG. 8 is a layout illustrating a phase difference detection pixel block of an image sensor based on some embodiments of the disclosed technology and color filter arrays of an image detection pixel block adjacent to the phase difference detection pixel block.

DETAILED DESCRIPTION

Figure 1:
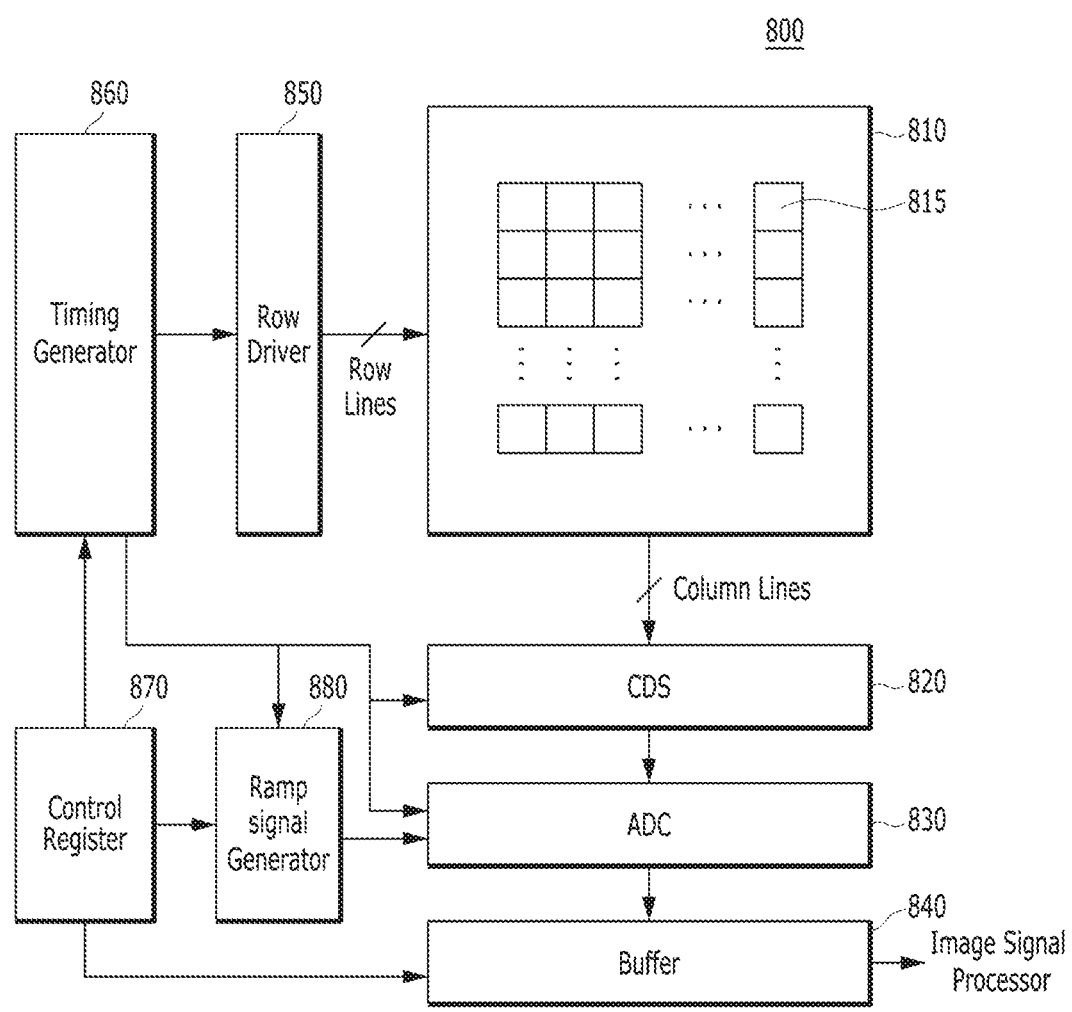
FIG. 1 is a block diagram schematically illustrating an image sensor based on some embodiments of the disclosed technology.

The terms used in this specification are only used to describe embodiments, and do not limit the present disclosure. In this specification, the terms of a singular form may include plural forms unless referred to the contrary. The meaning of 'comprise' and 'comprising' used in the specification specifies a component, step, operation, and/or element, but does not exclude the presence or addition of one or more other components, steps, operations, and/or elements.

When one element is referred to as being 'connected to' or 'coupled to' another element, it may indicate that the former element is directly connected or coupled to the latter element or another element is interposed therebetween. On the other hand, when one element is referred to as being 'directly connected to' or 'directly coupled to' another element, it may indicate that no element is interposed therebetween. Furthermore, 'and/or' includes each of described items and one or more combinations thereof.

The terms such as 'below', 'beneath', 'lower', 'above' and 'upper', which are spatially relative terms, may be used to easily describe the correlations between one element or components and another element or other components as illustrated in the drawings. The spatially relative terms should be understood as terms including different directions of elements during use or operation, in addition to directions illustrated in the drawings. For example, when an element illustrated in the drawings is turned over, the element which is referred to as being 'below' or 'beneath' another element may be placed above another element.

Moreover, embodiments of the disclosed technology will be described with reference to sectional views and/or plan views which have been shown and described by way of example and not by limitation. In the drawings, the dimensions of layers and regions may be exaggerated to effectively describe technical contents. Thus, shapes of the exemplary views may be modified depending on a manufacturing technique and/or allowable error. Therefore, embodiments of the disclosed technology may not be limited to specific shapes illustrated in the drawings, but include other shapes that are created depending on fabrication processes. For example, a right-angled region may be modified into a rounded shape or have a certain curvature. Thus, the regions illustrated in the drawings are schematic in nature and their shapes are not intended to illustrate the precise shape of an element and are not intended to limit the scope of the disclosed technology.

Throughout the specification, like reference numerals refer to like elements. Therefore, although the same or similar reference numerals are not mentioned or described in the corresponding drawing, the reference numerals may be described with reference to other drawings. Furthermore, although elements are not represented by reference numerals, the elements may be described with reference to other drawings.

An imaging sensor array of imaging pixels can be used to convert received incident light onto different imaging pixels into electrical charges or signals to represent images carried in the incident light. The imaging pixels can be semiconductor photosensors formed a substrate such as CMOS sensors. Each imaging pixel may be implemented by a photo-sensing element such as a photodiode, a photo transistor, a photo gate, or other photosensitive circuitry capable of converting light into a pixel signal (e.g., a charge, a voltage or a current). In an imaging device such as a digital camera, a camera lens system that often includes a set of camera lenses is provided to capture incident light from a target object or scene onto the imaging sensor array and a pixel optical structure formed over the imaging pixels in the imaging sensor array is used to receive the incident light from the camera lens system and to break the received incident light into individual pixel light beams to individual imaging pixels. In many imaging devices, the pixel optical structure formed over the imaging pixels can include an array of microlenses that spatially correspond to the imaging pixels in the imaging sensor array to improve the optical collection efficiency and may also include optical color filters that are placed to spatially correspond to the imaging pixels for capturing the color information of images. Some specific examples in this patent document shows a pixel arrangement of colored imaging pixels labeled as "R" for a red colored pixel, "G" for a green colored pixel, and "B" for a blue colored pixel.

FIG. 1 is a block diagram schematically illustrating an example of an image sensor 800 based on some embodiments of the disclosed technology. Referring to FIG. 1, the image sensor 800 may include a pixel array 810, a correlated double sampler (CDS) 820, an analog-digital converter (ADC) 830, a buffer 840, a row driver 850, a timing generator 860, a control register 870 and a ramp signal generator 880.

The pixel array 810 may include a plurality of pixel blocks 815 arranged in a matrix structure. Each of the pixel blocks 815 may convert optical image information (e.g., incident light photons) into an electrical image signal, and transfer the electrical image signal to the CDS 820 through column lines. Each of the pixel blocks 815 may be coupled to one of row lines and one of the column lines. The pixel blocks 815 may include general pixels for expressing colors and phase difference detection pixels for detecting a phase difference of light.

A CMOS image sensor may use the correlated double sampling (CDS) to remove an offset value of pixels by sampling a pixel signal twice so that the difference is taken between these two samples. In an embodiment of the disclosed technology, the correlated double sampling (CDS) may remove an offset value of pixels by comparing pixel signals (pixel output voltages) obtained before and after light is incident on the pixels so that only pixel signals based on the incident light can be actually measured. The CDS 820 may temporarily store and sample the electrical image signals received from the pixel blocks 815 of the pixel array 810. For example, the CDS 820 may sample a reference voltage level and voltage levels of the received electrical image signals according to a clock signal provided from the timing generator 860, and transfer analog signals corresponding to differences therebetween to the ADC 830.

The ADC 830 may convert the received analog signals into digital signals, and transfer the digital signals to the buffer 840.

The buffer 840 may hold or latch the received digital signals, and sequentially output the latched signals to an external image signal processor. The buffer 840 may include a memory for holding or latching the digital signals and a sense amplifier for amplifying the digital signals.

The row driver 850 may drive the plurality of pixel blocks 815 of the pixel array 810 according to a signal of the timing generator 860. For example, the row driver 850 may generate select signals for selecting one row line among the plurality of row lines and/or driving signals for driving one row line.

The timing generator 860 may generate a timing signal for controlling the CDS 820, the ADC 830, the row driver 850 and the ramp signal generator 880.

The control register 870 may generate control signals for controlling the buffer 840, the timing generator 860 and the ramp signal generator 880.

The ramp signal generator 880 may generate a ramp signal to be used to convert analog signals (e.g., electrical image signals outputted from the buffer 840) into digital signals, under control of the timing generator 860.

Figure 2:
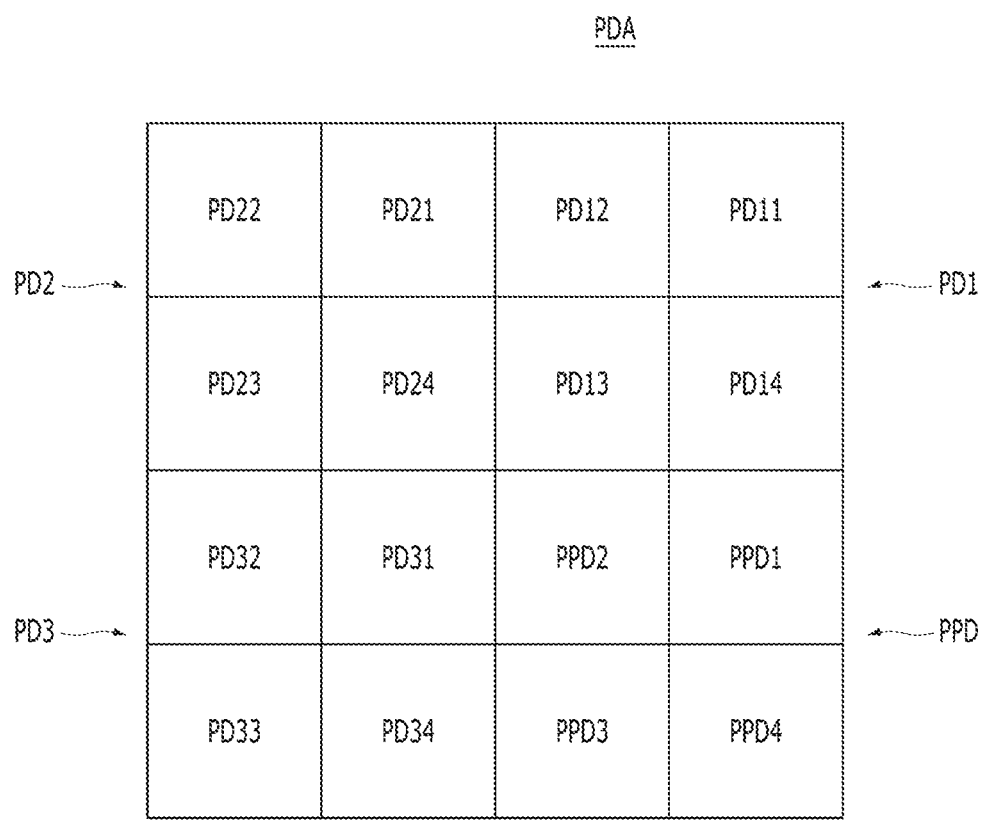
FIG. 2 illustrates a photodiode array within a phase difference detection pixel block of the image sensor based on some embodiments of the disclosed technology.
Figure 3:
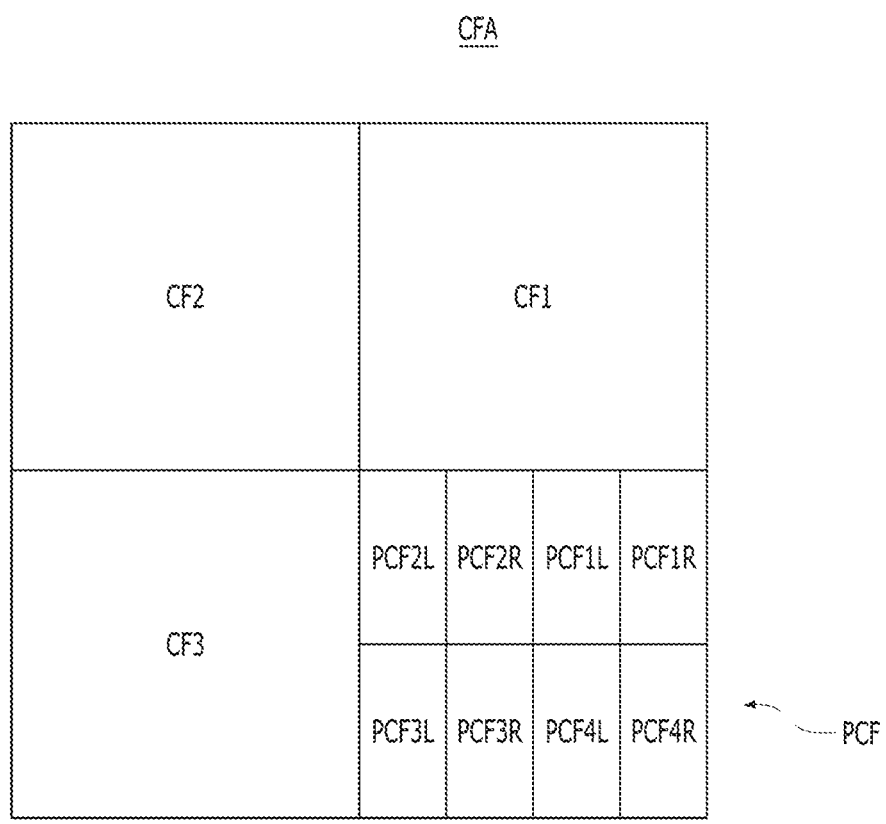
FIG. 3 illustrates a color filter array within the phase difference detection pixel block.
Figure 4:
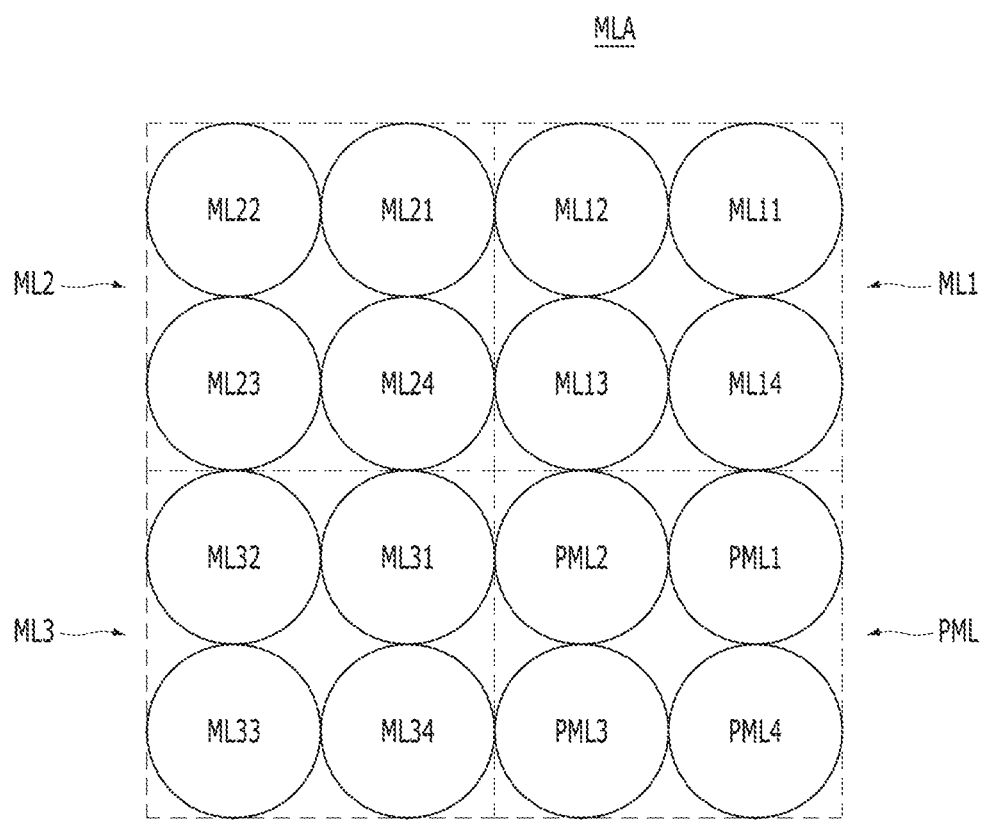
FIG. 4 is a layout conceptually illustrating a micro-lens array within the phase difference detection pixel block.

FIG. 2 illustrates a photodiode array PDA of a pixel block within the pixel array 810 of the image sensor 800 based on some embodiments of the disclosed technology, FIG. 3 illustrates a color filter array CFA, and FIG. 4 is a layout conceptually illustrating a micro-lens array MLA.

Image sensors include image detection pixels dedicated to image sensing. In some implementations, image sensors with phase detection autofocus (PDAF) have, in addition to the image detection pixels, a number of phase difference detection pixels dedicated to phase difference detection. In this patent document, photo-sensing elements and color filters on top of the photo-sensing elements in the image detection pixels are referred to as image detection photodiodes and image detection color filter, respectively, and photo-sensing elements and color filters in the phase difference detection pixels are referred to as phase difference detection photodiodes and phase difference detection color filter, respectively.

Referring to FIG. 2, the photodiode array PDA may have a matrix structure in which a first image detection photodiode set PD1 is positioned in a first quadrant direction, a second image detection photodiode set PD2 is positioned in a second quadrant direction, a third image detection photodiode set PD3 is positioned in a third quadrant direction, and a phase difference detection photodiode set PPD is positioned in a fourth quadrant direction.

The first image detection photodiode set PD1 may include first unit image detection photodiodes PD11 to PD14 disposed in the first to fourth quadrant directions, respectively. The second image detection photodiode set PD2 may include second unit image detection photodiodes PD21 to PD24 disposed in the first to fourth quadrant directions, respectively. The third image detection photodiode set PD3 may include third unit image detection photodiodes PD31 to PD34 disposed in the first to fourth quadrant directions, respectively.

The phase difference detection photodiode set PPD may include the first to fourth unit phase difference detection photodiodes PPD1 to PPD4 disposed in the first to fourth quadrant directions, respectively. The first to third unit image detection photodiodes PD11 to PD14, PD21 to PD24 and PD31 to PD34 and the unit phase difference detection photodiodes PPD1 to PPD4 may be optically isolated from one another. For example, optical isolation regions such as deep trench isolation (DTI) regions or P-type ion implantation regions may be formed among the first to third unit image detection photodiodes PD11 to PD14, PD21 to PD24 and PD31 to PD34 and the unit phase difference detection photodiodes PPD1 to PPD4.

Referring to FIG. 3, the color filter array CFA may have a matrix structure in which a first image detection color filter set CF1 is positioned in a first quadrant direction, a second image detection color filter set CF2 is positioned in a second quadrant direction, a third image detection color filter set CF3 is positioned in a third quadrant direction, and a phase difference detection color filter set PCF is positioned in a fourth quadrant direction.

The phase difference detection color filter set PCF may include a first phase difference detection color filter pair PCF1L and PCF1R positioned in the first quadrant direction, a second phase difference detection color filter pair PCF2L and PCF2R positioned in the second quadrant direction, a third phase difference detection color filter pair PCF3L and PCF3R positioned in the third quadrant direction, and a fourth phase difference detection color filter pair PCF4L and PCF4R positioned in the fourth quadrant direction. The first phase difference detection color filter pair PCF1L and PCF1R may include a first left phase difference detection color filter PCF1L and a first right phase difference detection color filter PCF1R, the second phase difference detection color filter pair PCF2L and PCF2R may include a second left phase difference detection color filter PCF2L and a second right phase difference detection color filter PCF2R, the third phase difference detection color filter pair PCF3L and PCF3R may include a third left phase difference detection color filter PCF3L and a third right phase difference detection color filter PCF3R, and the fourth phase difference detection color filter pair PCF4L and PCF4R may include a fourth left phase difference detection color filter PCF4L and a fourth right phase difference detection color filter PCF4R. In this patent document, the terms "left phase difference detection color filter" and "right phase difference detection color filter" indicate a color filter that partially covers a unit phase difference detection photodiode. The "left" phase difference detection color filter may indicate a color filter located on one part of a unit phase difference detection photodiode, and the "right" phase difference detection color filter may indicate another color filter located on another part of the unit phase difference detection photodiode. For example, the "left" phase difference detection color filter may indicate a color filter located on one half of a unit phase difference detection photodiode, and the "right" phase difference detection color filter may indicate another color filter located on the other half of the unit phase difference detection photodiode.

Figure 9A:
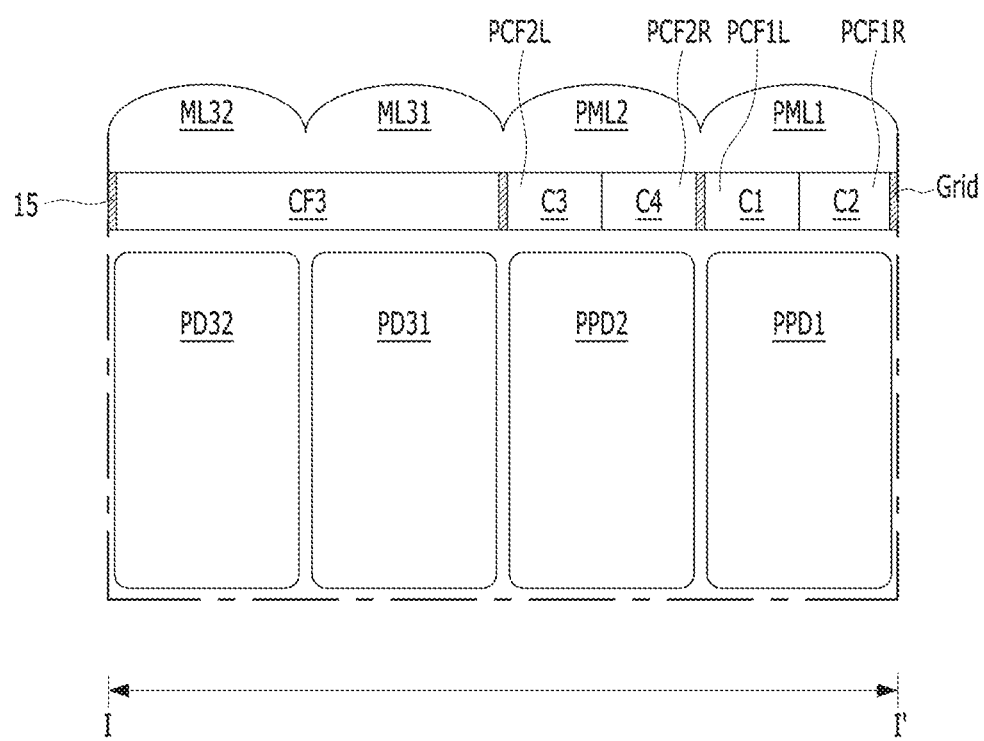
FIG. 9A is a longitudinal cross-sectional view of the phase difference detection pixel block of the image sensor of FIG. 6A, to which the phase difference detection color filter set of FIG. 7A is applied, taken along the line I-I' of FIG. 6A.
Figure 9B:
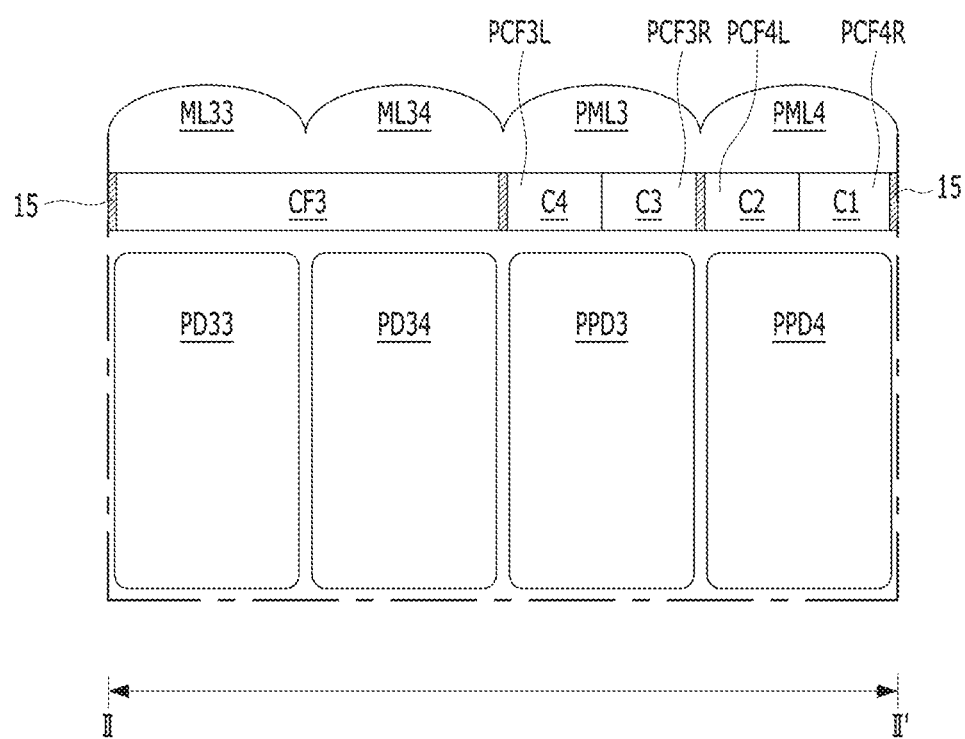
FIG. 9B is a longitudinal cross-sectional view taken along the line II-II' of FIG. 6A.
Figure 9C:
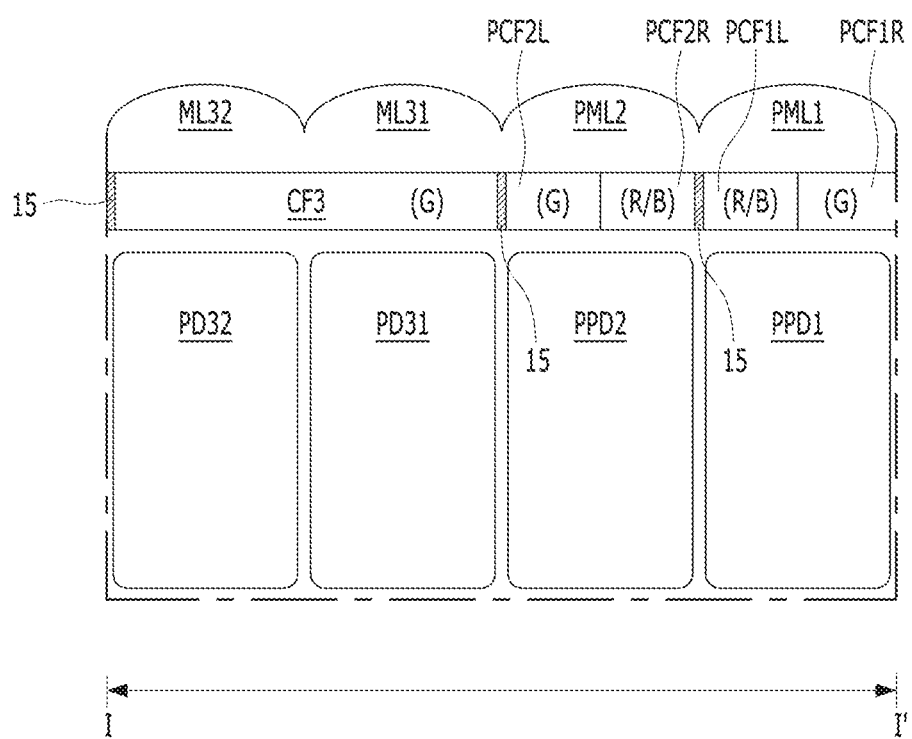
FIG. 9C is a longitudinal cross-sectional view of the phase difference detection pixel block of the image sensor of FIG. 6A or 8, to which the phase difference detection color filter set of FIG. 7D is applied, taken along the line I-I' of FIG. 6A.

In the present embodiment, each of the first to third image detection color filter sets CF1 to CF3 may be one merged color filter having the same color. In another embodiment, each of the first to third image detection color filter sets CF1 to CF3 may include four color filters having the same color. The first to third image detection color filter sets CF1 to CF3, the first left phase difference detection color filter PCF1L, the first right phase difference detection color filter PCF1R, the second left phase difference detection color filter PCF2L, the second right phase difference detection color filter PCF2R, the third left phase difference detection color filter PCF3L, the third right phase difference detection color filter PCF3R, the fourth left phase difference detection color filter PCF4L and the fourth right phase difference detection color filter PCF4R may be optically and/or physically isolated from one another by a grid. The grid is illustrated in FIGS. 9A to 9C. In another embodiment, four color filters within each of the first to third image detection color filter sets CF1 to CF3 may also be isolated from one another by the grid.

Referring to FIG. 4, the micro-lens array MLA of the pixel block may have a matrix structure in which a first image detection micro-lens set ML1 is positioned in a first quadrant direction, a second image detection micro-lens set ML2 is positioned in a second quadrant direction, a third image detection micro-lens set ML3 is positioned in a third quadrant direction, and a phase difference detection micro-lens set PML is positioned in a fourth quadrant direction.

The first image detection micro-lens set ML1 may include first unit image detection micro-lenses ML11 to ML14 positioned in the first to fourth quadrant directions, respectively, the second image detection micro-lens set ML2 may include second unit image detection micro-lenses ML21 to ML24 positioned in the first to fourth quadrant directions, respectively, the third image detection micro-lens set ML3 may include third unit image detection micro-lenses ML31 to ML34 positioned in the first to fourth quadrant directions, respectively, and the phase difference detection micro-lens set PML may include first to fourth unit phase difference detection micro-lenses PML1 to PML4 positioned in the first to fourth quadrant directions, respectively.

Figure 5:
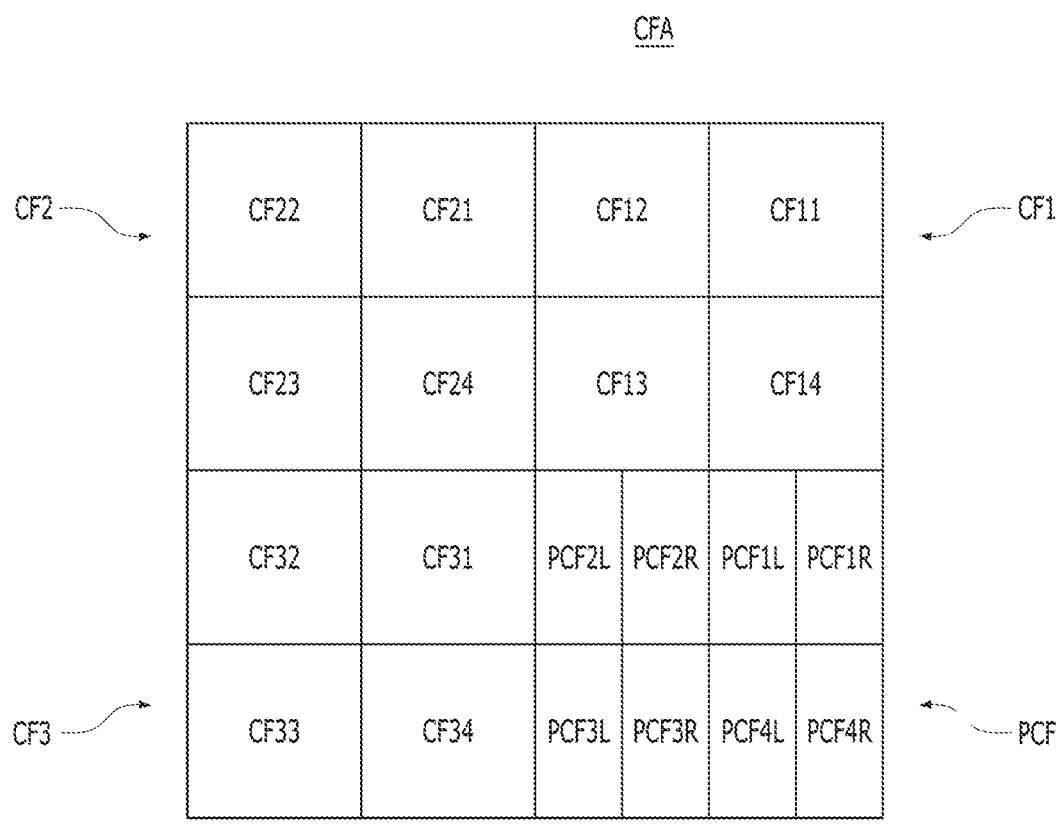
FIG. 5 is a layout illustrating a color filter array CFA of a pixel block in an image sensor based on some embodiments of the disclosed technology.

FIG. 5 is a layout illustrating a color filter array CFA of a pixel block of an image sensor based on some embodiments of the disclosed technology. Referring to FIG. 5, the color filter array CFA of the pixel block may have a matrix structure in which a first image detection color filter set CF1 is positioned in a first quadrant direction, a second image detection color filter set CF2 is positioned in a second quadrant direction, a third image detection color filter set CF3 is positioned in a third quadrant direction, and a phase difference detection color filter set PCF is positioned in a fourth quadrant direction. Compared to the color filter array CFA illustrated in FIG. 3, the first image detection color filter set CF1 may include first unit image detection color filters CF11 to CF14 arranged in a matrix with rows and columns, the second image detection color filter set CF2 may include second unit image detection color filters CF21 to CF24 arranged in a matrix with rows and columns, and the third image detection color filter set CF3 may include third unit image detection color filters CF31 to CF34 arranged in a matrix with rows and columns. The first unit image detection color filters CF11 to CF14 may have the same color, the second unit image detection color filters CF21 to CF24 may have the same color, and the third unit image detection color filters CF31 to CF34 may have the same color. The components that are not described herein will be able to be understood with reference to FIG. 3.

The first to third unit image detection color filters CF11 to CF14, CF21 to CF24 and CF31 to CF34, the first left phase difference detection color filter PCF1L, the first right phase difference detection color filter PCF1R, the second left phase difference detection color filter PCF2L, the second right phase difference detection color filter PCF2R, the third left phase difference detection color filter PCF3L, the third right phase difference detection color filter PCF3R, the fourth left phase difference detection color filter PCF4L and the fourth right phase difference detection color filter PCF4R may be optically and/or physically isolated from one another by a grid. The grid is illustrated in FIGS. 9A to 9C.

Figure 6A:
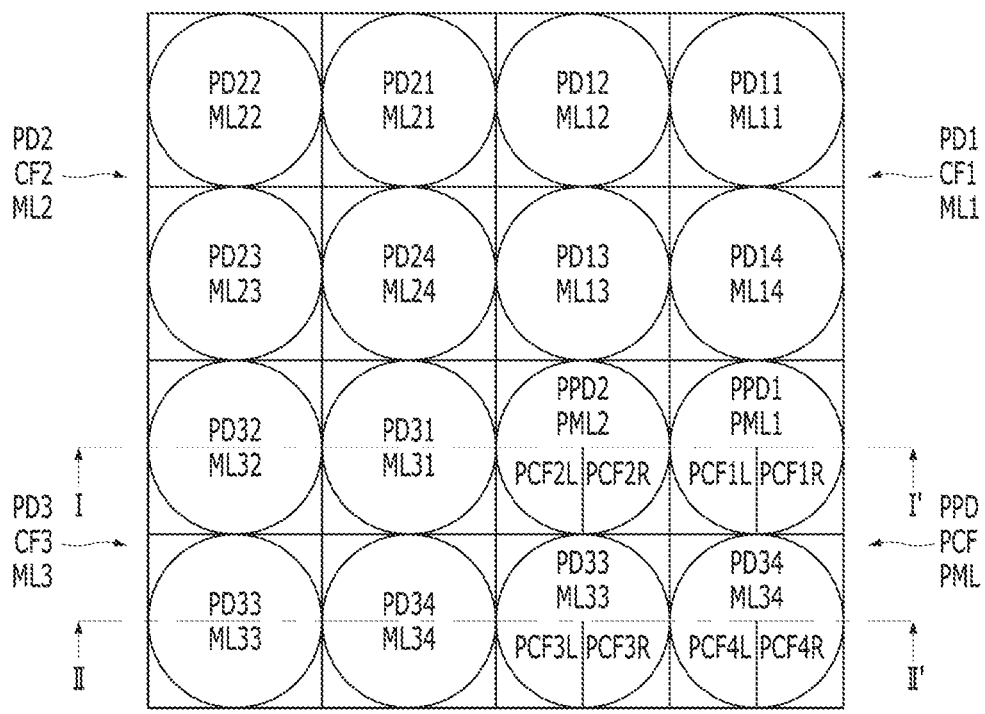
FIG. 6A is a conceptual layout of the phase difference detection pixel block in which the photodiode array illustrated in FIG. 2, the color filter array illustrated in FIG. 3 and the micro-lens array illustrated in FIG. 4 are overlaid.

FIG. 6A is a conceptual layout illustrating that the photodiode array PDA illustrated in FIG. 2, the color filter array CFA illustrated in FIG. 3 and the micro-lens array MLA illustrated in FIG. 4 are overlaid. In some implementations, the micro-lens array MLA is disposed over the color filter array CFA, and the color filter array CFA is disposed over the photodiode array PDA. In this way, the micro-lens array MLA, the color filter array CFA, and the photodiode array PDA may overlap one another. Referring to FIG. 6A, the first image detection photodiode set PD1, the first image detection color filter set CF1 and the first image detection micro-lens set ML1 may overlap one another, the second image detection photodiode set PD2, the second image detection color filter set CF2 and the second image detection micro-lens set ML2 may overlap one another, the third image detection photodiode set PD3, the third image detection color filter set CF3 and the third image detection micro-lens set ML3 may overlap one another, and the phase difference detection photodiode set PPD, the phase difference detection color filter set PCF and the phase difference detection micro-lens set PML may overlap one another.

Specifically, the four first unit image detection photodiodes PD11 to PD14, the first image detection color filter set CF1 and the four first unit image detection micro-lenses ML11 to ML14 may overlap one another, the four second unit image detection photodiodes PD21 to PD24, the second image detection color filter set CF2 and the four second unit image detection micro-lenses ML21 to ML24 may overlap one another, the four third unit image detection photodiodes PD31 to PD34, the third image detection color filter set CF3 and the four third unit image detection micro-lenses ML31 to ML34 may overlap one another, and the four unit phase difference detection photodiodes PPD1 to PPD4, the eight unit phase difference detection color filters PCF1L, PCF1R, PCF2L, PCF2R, PCF3L, PCF3R, PCF4L and PCF4R and the four unit phase difference detection micro-lenses PML1 to PML4 may overlap one another.

More specifically, the four first unit image detection photodiodes PD11 to PD14 and the four first unit image detection micro-lenses ML11 to ML14 may be superimposed to share the first image color filter set CF1, the four second unit image detection photodiodes PD21 to PD24 and the four second unit image detection micro-lenses ML21 to ML24 may be superimposed to share the second image color filter set CF2, and the four third unit image detection photodiodes PD31 to PD34 and the third unit first image detection micro-lenses ML31 to ML34 may be superimposed to share the third image color filter set CF3. Therefore, the four first unit image detection photodiodes PD11 to PD14 may accept the same color of light, the four second unit image detection photodiodes PD21 to PD24 may accept the same color of light, and the four third unit image detection photodiodes PD31 to PD34 may accept the same color of light. Each of the first to third unit image detection photodiodes PD11 to PD14, PD21 to PD24 and PD31 to PD34 and each of the first to third unit image detection micro-lenses ML11 to ML14, ML21 to ML24 and ML31 to ML34 may overlap in an one-to-one relationship.

The first unit phase difference detection photodiode PPD1, the first phase difference detection color filter pair PCF1L and PCF1R, and the unit first phase difference detection micro-lens PML1 may overlap one another, the second unit phase difference detection photodiode PPD2, the second phase difference detection color filter pair PCF2L and PCF2R and the unit second phase difference detection micro-lens PML2 may overlap one another, the third unit phase difference detection photodiode PPD3, the third phase difference detection color filter pair PCF3L and PCF3R and the unit third phase difference detection micro-lens PML3 may overlap one another, and the fourth unit phase difference detection photodiode PPD4, the fourth phase difference detection color filter pair PCF4L and PCF4R and the unit fourth phase difference detection micro-lens PML4 may overlap one another. For example, the first phase difference detection color filter pair PCF1L and PCF1R may share the first unit phase difference detection photodiode PPD1 and the first unit phase difference detection micro-lens PML1, the second phase difference detection color filter pair PCF2L and PCF2R may share the second unit phase difference detection photodiode PPD2 and the second unit phase difference detection micro-lens PML2, the third phase difference detection color filter pair PCF3L and PCF3R may share the third unit phase difference detection photodiode PPD3 and the third unit phase difference detection micro-lens PML3, and the fourth phase difference detection color filter pair PCF4L and PCF4R may share the fourth unit phase difference detection photodiode PPD4 and the fourth unit phase difference detection micro-lens PML4.

Figure 6B:
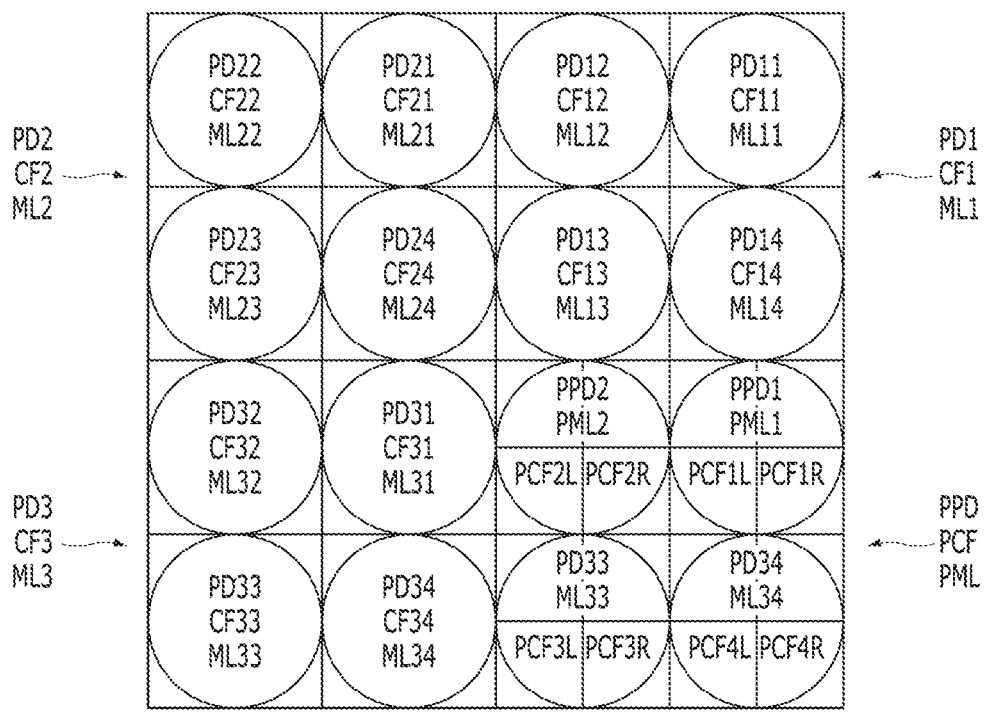
FIG. 6B is a conceptual layout of the phase difference detection pixel block in which the photodiode array illustrated in FIG. 2, the color filter array illustrated in FIG. 5 and the micro-lens array illustrated in FIG. 4 are overlaid.

FIG. 6B is a conceptual layout illustrating that the photodiode array PDA illustrated in FIG. 2, the color filter array CFA illustrated in FIG. 5 and the micro-lens array MLA illustrated in FIG. 4 are overlaid. Specifically, referring to FIG. 6B, the four first unit image detection photodiodes PD11 to PD14, the four first unit image detection color filters CF11 to CF14 and the four first unit image detection micro-lenses ML11 to ML14 may overlap one another, the four second unit image detection photodiodes PD21 to PD24, the four second image detection color filters CF21 to CF24 and the four second unit image detection micro-lenses ML21 to ML24 may overlap one another, the four third unit image detection photodiodes PD31 to PD34, the four third image detection color filters CF31 to CF34 and the four third unit image detection micro-lenses ML31 to ML34 may overlap one another, and the four unit phase difference detection photodiodes PPD1 to PPD4, the eight unit phase difference detection color filters PCF1L, PCF1R, PCF2L, PCF2R, PCF3L, PCF3R, PCF4L and PCF4R and the four unit phase difference detection micro-lenses PML1 to PML4 may overlap one another.

Figure 7A:
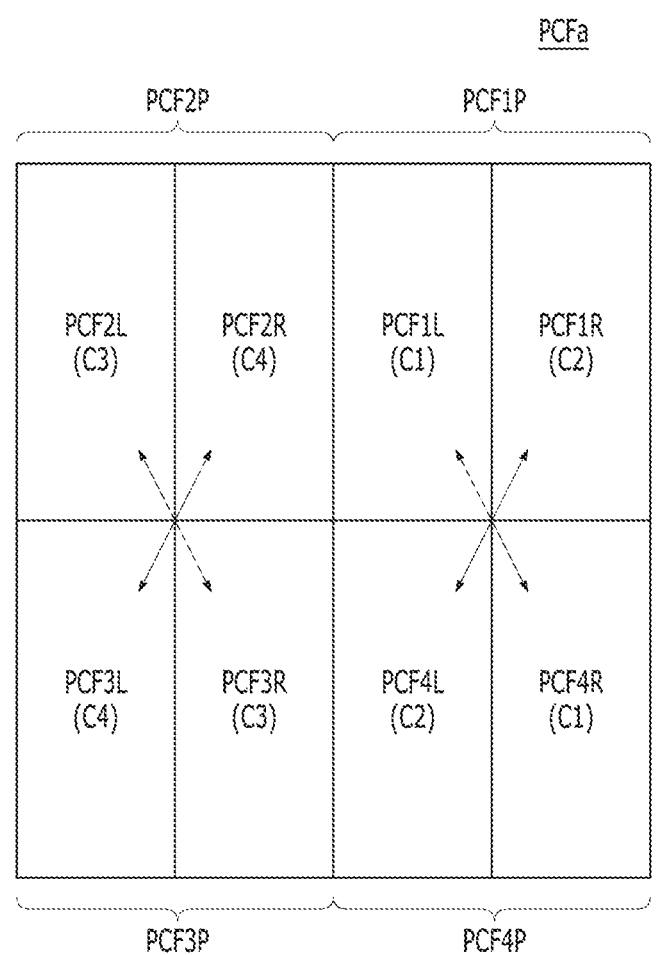
FIGS. 7A to 7E illustrate color arrangements of the phase difference detection color filter sets based on some embodiments of the disclosed technology.
Figure 7B:
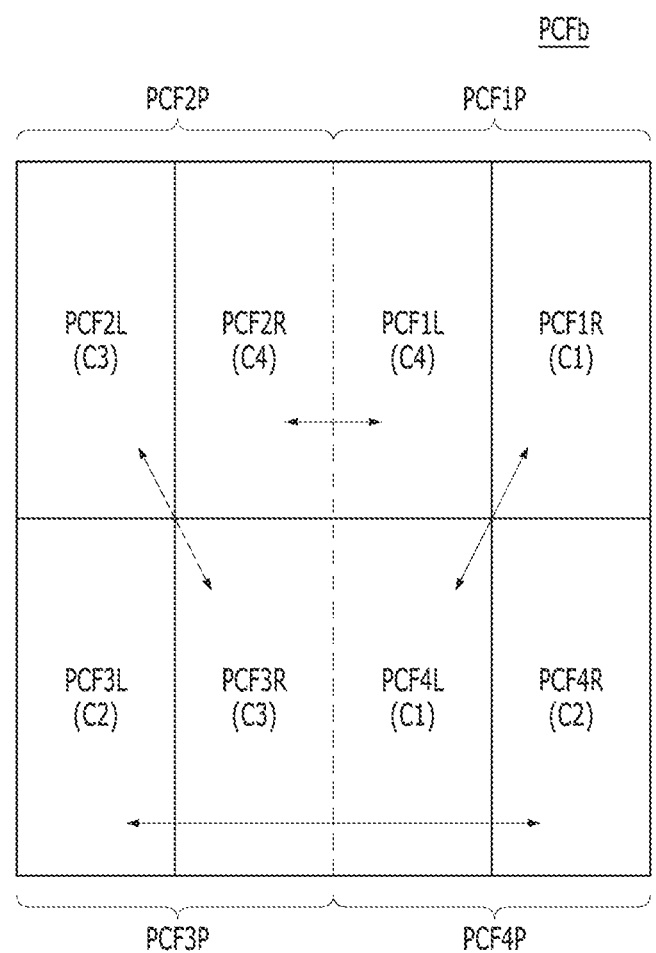
Figure 7C:
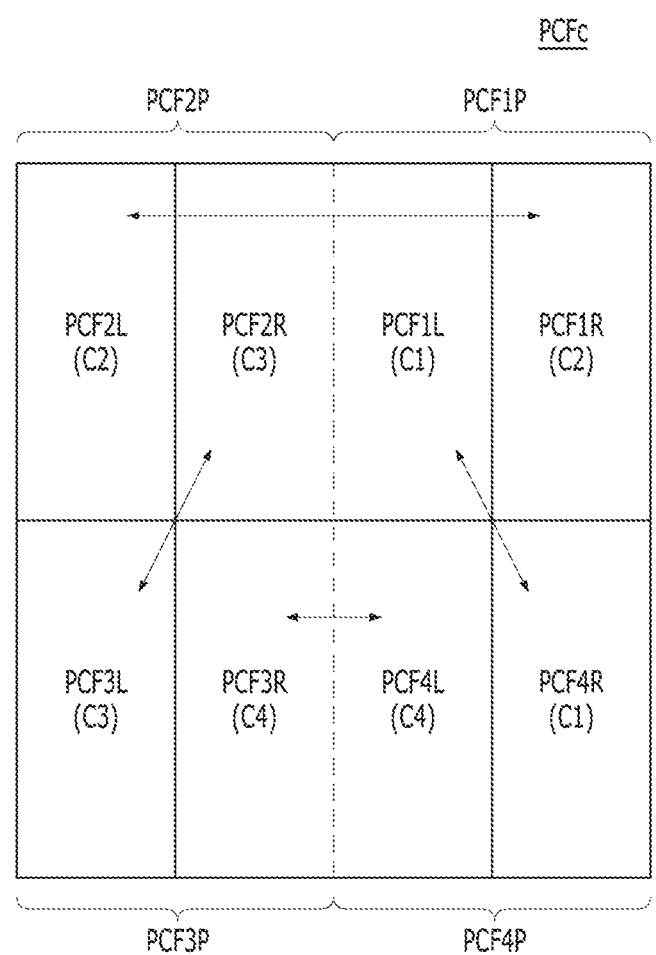

FIGS. 7A to 7E illustrate color arrangements of phase difference detection color filter sets PCFa to PCFe based on some embodiments of the disclosed technology. Referring to FIGS. 7A to 7C, each of the phase difference detection color filter sets PCFa to PCFe may include a first phase difference detection color filter pair PCF1P positioned in a first quadrant direction, a second phase difference detection color filter pair PCF2P positioned in a second quadrant direction, a third phase difference detection color filter pair PCF3P positioned in a third quadrant direction, and a fourth phase difference detection color filter pair PCF4P positioned in a fourth quadrant direction.

Referring to FIG. 7A, the first phase difference detection color filter pair PCF1P may have a first left phase difference detection color filter PCF1L of first color C1 and a first right phase difference detection color filter PCF1R of second color C2, the second phase difference detection color filter pair PCF2P may have a second left phase difference detection color filter PCF2L of third color C3 and a second right phase difference detection color filter PCF2R of fourth color C4, the third phase difference detection color filter pair PCF3P may have a third left phase difference detection color filter PCF3L of the fourth color C4 and a third right phase difference detection color filter PCF3R of the third color C3, and the fourth phase difference detection color filter pair PCF4P may have a fourth left phase difference detection color filter PCF4L of the second color C2 and a fourth right phase difference detection color filter PCF4R of the first color C1. As indicated by arrows, the phase difference detection color filters PCF1L and PCF4R, PCF1R and PCF4L, PCF2L and PCF3R and PCF2R and PCF3L having the same colors may be arranged in diagonal directions to have an X-shaped arrangement.

Referring to FIG. 7B, the first phase difference detection color filter pair PCF1P may have a first left phase difference detection color filter PCF1L of the fourth color C4 and a first right phase difference detection color filter PCF1R of the first color C1, the second phase difference detection color filter pair PCF2P may have a second left phase difference detection color filter PCF2L of the third color C3 and a second right phase difference detection color filter PCF2R of the fourth color C4, the third phase difference detection color filter pair PCF3P may have a third left phase difference detection color filter PCF3L of the second color C2 and a third right phase difference detection color filter PCF3R of the third color C3, and the fourth phase difference detection color filter pair PCF4P may have a fourth left phase difference detection color filter PCF4L of the first color C1 and a fourth right phase difference detection color filter PCF4R of the second color C2. For example, the phase difference detection color filters PCF1R and PCF4L having the first color C1 may be symmetrically arranged in a diagonal direction, and the color filters PCF2L and PCF3R having the third color C3 may be symmetrically arranged in a diagonal direction. The phase difference detection color filters PCF3L and PCF4R having the second color C2 may be spaced apart from each other, and the phase difference detection color filters PCF1L and PCF2R having the fourth color C4 may be disposed adjacent to each other.

The first left phase difference detection color filter PCF1L and the second right phase difference detection color filter PCF2R, which are arranged adjacent to each other in a row direction and have the same color C4, may be integrated with each other. For example, as indicated by a dotted line, the boundary or grid between the first left phase difference detection color filter PCF1 and the second right phase difference detection color filter PCF2R may be omitted. Furthermore, when the first and third colors C1 and C3 are the same color, for example, green (G), the third right phase difference detection color filter PCF3R and the fourth left phase difference detection color filter PCF4L, which are disposed adjacent to each other in the row direction, may also be integrated with each other. For example, as indicated by a dotted line, the boundary or grid between the third right phase difference detection color filter PCF3R and the fourth left phase difference detection color filter PCF4L may be omitted.

Referring to FIG. 7C, the first phase difference detection color filter pair PCF1P may have a first left phase difference detection color filter PCF1L of the first color C1 and a first right phase difference detection color filter PCF1R of the second color C2, the second phase difference detection color filter pair PCF2P may have a second left phase difference detection color filter PCF2L of the second color C2 and a second right phase difference detection color filter PCF2R of the third color C3, the third phase difference detection color filter pair PCF3P may have a third left phase difference detection color filter PCF3L of the third color C3 and a third right phase difference detection color filter PCF3R of the fourth color C4, and the fourth phase difference detection color filter pair PCF4P may have a fourth left phase difference detection color filter PCF4L of the fourth color C4 and a fourth right phase difference detection color filter PCF4R of the first color C1. The phase difference detection color filter set PCFb of FIG. 7B and the phase difference detection color filter set PCFc of FIG. 7C may have a horizontally symmetrical shape or mirrored arrangement. For example, the phase difference detection color filters PCF1L and PCF4R having the first color C1 and the phase difference detection color filters PCF2R to PCF3L having the third color C3 may be symmetrically arranged in diagonal directions, the phase difference detection color filters PCF3R and PCF4L having the fourth color C4 may be arranged adjacent to each other, and the phase difference detection color filters PCF1R and PCF2L having the second color C2 may be spaced apart from each other.

The third right phase difference detection color filter PCF3R and the fourth left phase difference detection color filter PCF4L, which are arranged adjacent to each other in the row direction and have the same color C4, may be integrated with each other. Furthermore, when the first and third colors C1 and C3 are the same color, for example, green (G), the first left phase difference detection color filter PCF1L and the second right phase difference detection color filter PCF2R, which are arranged adjacent to each other in the row direction, may also be integrated with each other. For example, as indicated by a dotted line, the boundary or grid between the first left phase difference detection color filter PCF1L and the second right phase difference detection color filter PCF2R and the boundary or grid between the third right phase difference detection color filter PCF3R and the fourth left phase difference detection color filter PCF4L may be omitted.

Figure 7D:
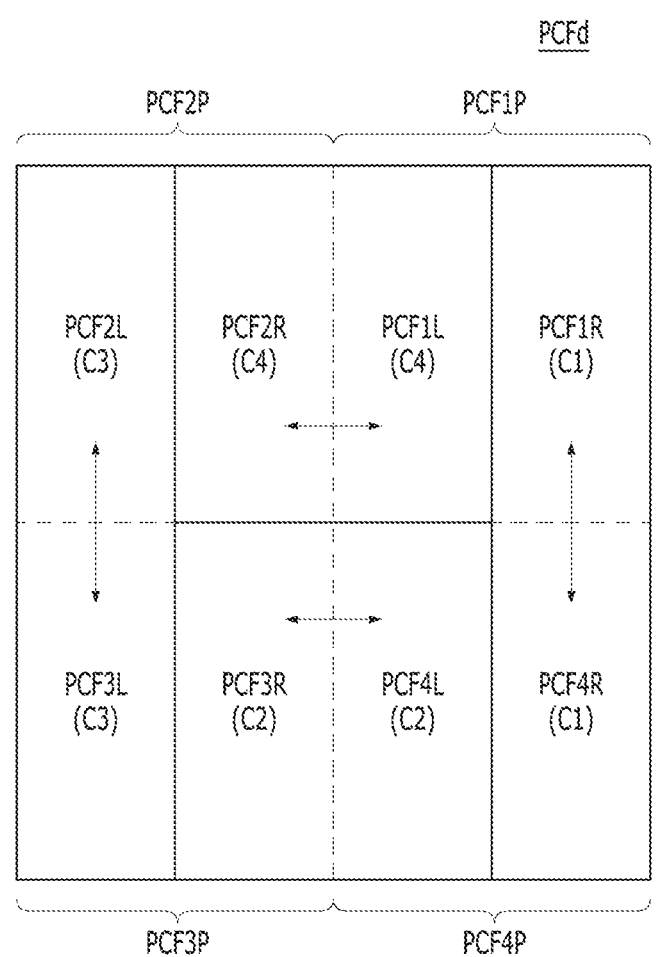

Referring to FIG. 7D, the first phase difference detection color filter pair PCF1P may have a first left phase difference detection color filter PCF1L of the fourth color C4 and a first right phase difference detection color filter PCF1R of the first color C1, the second phase difference detection color filter pair PCF2P may have a second left phase difference detection color filter PCF2L of the third color C3 and a second right phase difference detection color filter PCF2R of the fourth color C4, the third phase difference detection color filter pair PCF3P may have a third left phase difference detection color filter PCF3L of the third color C3 and a third right phase difference detection color filter PCF3R of the second color C2, and the fourth phase difference detection color filter pair PCF4P may have a fourth left phase difference detection color filter PCF4L of the second color C2 and a fourth right phase difference detection color filter PCF4R of the first color C1. For example, the phase difference detection color filters PCF1R and PCF4L having the first color C1 and the phase difference detection color filters PCF2L and PCF3L having the third color C3 may be arranged in a column direction, and the phase difference detection color filters PCF3R and PCF4L having the second color C2 and the phase difference detection color filters PCF1L and PCF2R having the fourth color C4 may be arranged adjacent to each other in the row direction.

The first left phase difference detection color filter PCF1L and the second right phase difference detection color filter PCF2R, which are arranged adjacent to each other in the row direction and have the same color C4, may be integrated with each other, and the third right phase difference detection color filter PCF3R and the fourth left phase difference detection color filter PCF4L, which are arranged adjacent to each other in the row direction and have the same color C2, may be integrated with each other. Furthermore, the first right phase difference detection color filter PCF1R and the fourth right phase difference detection color filter PCF4R, which are arranged adjacent to each other in the column direction and have the same color C1, may also be integrated with each other, and the second left phase difference detection color filter PCF2L and the third left phase difference detection color filter PCF3L, which are arranged adjacent to each other in the column direction and have the same color C3, may also be integrated with each other. For example, as indicated by dotted lines, the boundary or grid between the first left phase difference detection color filter PCF1L and the second right phase difference detection color filter PCF2R, the boundary or grid between the third right phase difference detection color filter PCF3R and the fourth left phase difference detection color filter PCF4L, the boundary or grid between the first right phase difference detection color filter PCF1R and the fourth right phase difference detection color filter PCF4R, and the boundary or grid between the second left phase difference detection color filter PCF2L and the third left phase difference detection color filter PCF3L may be omitted.

Figure 7E:
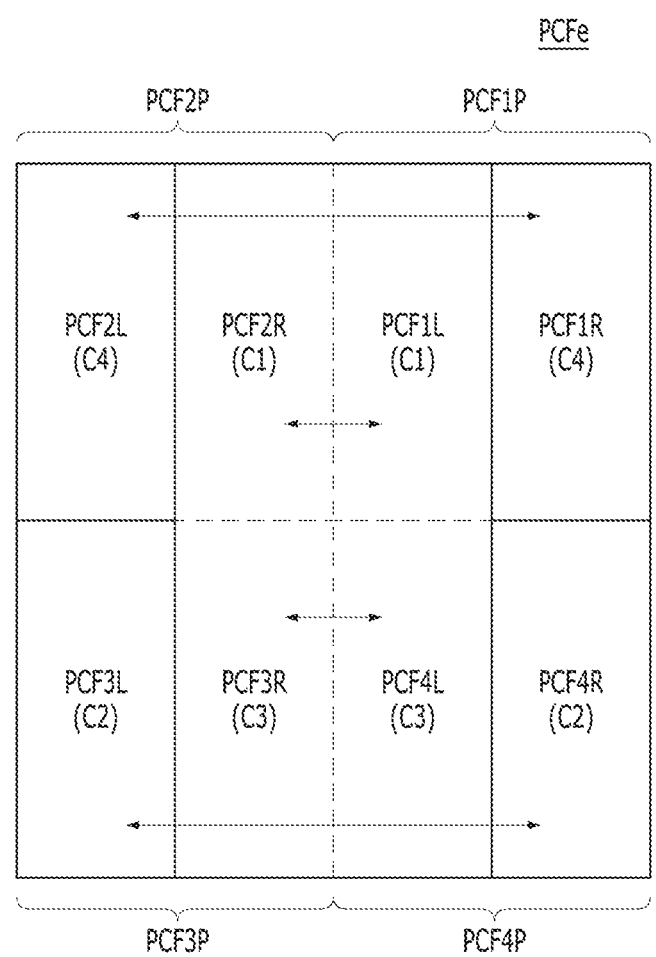

Referring to FIG. 7E, the first phase difference detection color filter pair PCF1P may have a first left phase difference detection color filter PCF1L of the first color C1 and a first right phase difference detection color filter PCF1R of the fourth color C4, the second phase difference detection color filter pair PCF2P may have a second left phase difference detection color filter PCF2L of the fourth color C4 and a second right phase difference detection color filter PCF2R of the first color C1, the third phase difference detection color filter pair PCF3P may have a third left phase difference detection color filter PCF3L of the second color C2 and a third right phase difference detection color filter PCF3R of the third color C3, and the fourth phase difference detection color filter pair PCF4P may have a fourth left phase difference detection color filter PCF4L of the third color C3 and a fourth right phase difference detection color filter PCF4R of the second color C2. For example, the phase difference detection color filters PCF1L and PCF2R having the first color C1 and the phase difference detection color filters PCF3R and PCF4L having the third color C3 may be arranged adjacent to each other in the row direction, and the phase difference detection color filters PCF3L and PCF4R having the second color C2 and the phase difference detection color filters PCF1R and PCF2L having the fourth color C4 may be spaced apart from each other in the row direction.

Further referring to FIGS. 7B, 7C and/or 7D, when the first and third colors C1 and C3 are the same color, for example, green (G), the first left phase difference detection color filter PCF1L, the second right phase difference detection color filter PCF2R, the third right phase difference detection color filter PCF3R and the fourth left phase difference detection color filter PCF4L, which are arranged adjacent to each other in the row direction and/or column direction, may be integrated with one another. Furthermore, as indicated by dotted lines, the boundaries or grids among the first left phase difference detection color filter PCF1L, the second right phase difference detection color filter PCF2R, the third right phase difference detection color filter PCF3R and the fourth left phase difference detection color filter PCF4L may be omitted.

In the embodiments described with reference to FIGS. 7A to 7E, the first and third colors C1 and C3 may be set to green, the second color C2 may be set to blue, and the fourth color C4 may be set to red. However, the colors C1 to C4 may be changed so as to be compatible with one another.

FIG. 8 is a layout illustrating color filter arrays CFA of an image sensor based on some embodiments of the disclosed technology. For example, the phase difference detection color filter set PCFd illustrated in FIG. 7D may be exemplified. Referring to FIG. 8, the first right phase difference detection color filter PCF1R, the second left phase difference detection color filter PCF2L, the third left phase difference detection color filter PCF3L and the fourth right phase difference detection color filter PCF4R, which are positioned at ends in the row direction among the phase difference detection color filters PCF1L, PCF1R, PCF2L, PCF2R, PCF3L, PCF3R, PCF4L and PCF4R, may have the same color as the image detection color filters CF3 adjacent thereto. In this case, as indicated by dotted lines, the boundary or grid between the first right phase difference detection color filter PCF1R and the third image detection color filter CF3 which are adjacent to each other, the boundary or grid between the fourth right phase difference detection color filter PCF4R and the third image detection color filter CF3 which are adjacent to each other, the boundary or grid between the second left phase difference detection color filter PCF2L and the third image detection color filter CF3 which are adjacent to each other, and the boundary or grid between the third left phase difference detection color filter PCF3L and the third image detection color filter CF3 which are adjacent to each other may be omitted.

FIG. 9A is a longitudinal cross-sectional view of the pixel block of the image sensor 800 of FIG. 6A, to which the phase difference detection color filter set PCFa illustrated in FIG. 7A is applied, taken along the line I-I' of FIG. 6A, and FIG. 9B is a longitudinal cross-sectional view taken along the line II-IP of FIG. 6A.

Referring to FIGS. 9A and 9B, the pixel block of the image sensor 800 implemented based on some embodiments of the disclosed technology may include third image detection photodiodes PD31 to PD34 and phase difference detection photodiodes PPD1 to PPD4 which are formed in a substrate 10, grid patterns 15 formed on the substrate 10, an image detection color filter CF3 and phase difference detection color filters PCF1L, PCF1R, PCF2L, PCF2R, PCF3L, PCF3R, PCF4L and PCF4R among the grid patterns 15, and third image detection micro-lenses ML31 to ML34 and phase difference detection micro-lenses PML1 to PML4 on the color filter CF3 and the phase difference detection color filters PCF1L, PCF1R, PCF2L, PCF2R, PCF3L, PCF3R, PCF4L and PCF4R.

The third image detection photodiodes PD31 to PD34 and the third image detection micro-lenses ML31 to ML34 may share the third image detection color filter CF3. Therefore, the third image detection photodiodes PD31 to PD34 may accept the same color of light.

Each of the phase difference detection photodiodes PPD1 to PPD4 and each of the phase difference detection micro-lenses PML1 to PML4 may share two of the eight phase difference detection color filters PCF1L, PCF1R, PCF2L, PCF2R, PCF3L, PCF3R, PCF4L and PCF4R. For example, the first unit phase difference detection photodiode PPD1 and the first unit phase difference detection micro-lenses PML1 may share the first left phase difference detection color filter PCF1L and the first right phase difference detection color filter PCF1R, the second unit phase difference detection photodiode PPD2 and the second unit phase difference detection micro-lenses PML2 may share the second left phase difference detection color filter PCF2L and the second right phase difference detection color filter PCF2R, the third unit phase difference detection photodiode PPD3 and the third unit phase difference detection micro-lenses PML3 may share the third left phase difference detection color filter PCF3L and the third right phase difference detection color filter PCF3R, and the fourth unit phase difference detection photodiode PPD4 and the fourth unit phase difference detection micro-lenses PML4 may share the fourth left phase difference detection color filter PCF4L and the fourth right phase difference detection color filter PCF4R. Therefore, each of the unit phase difference detection photodiodes PPD1 to PD4 may accept two colors of light. Specifically, the first unit phase difference detection photodiode PPD1 may accept the first color C1 of light and the second color C2 of light, the second unit phase difference detection photodiode PPD2 may accept the third color C3 of light and the fourth color C4 of light, the third unit phase difference detection photodiode PPD3 may accept the third color C3 of light and the fourth color C4 of light, and the fourth unit phase difference detection photodiode PPD4 may accept the first color C1 of light and the second color C2 of light. Simply speaking, each of the unit phase difference detection photodiodes PPD1 to PPD4 may accept two colors of light together.

Among the phase difference detection color filters PCF1L, PCF1R, PCF2L, PCF2R, PCF3L, PCF3R, PCF4L and PCF4R, two color filters overlapping each of the first to fourth unit phase difference detection photodiodes PPD1 to PPD4 may not be isolated by the grid patterns 15, but directly contact each other.

FIG. 9C is a longitudinal cross-sectional view of the pixel block of the image sensor 800 of FIG. 6A or 8, to which the phase difference detection color filter set PCFd illustrated in FIG. 7D is applied, taken along the line I-I' of FIG. 6A. Referring to FIG. 9C, the pixel block of the image sensor 800 in accordance with the present embodiment may include third image detection photodiodes PD31 to PD34 and phase difference detection photodiodes PPD1 to PPD4 which are formed in a substrate 10, grid patterns 15 formed on the substrate 10, an image detection color filter CF3 and phase difference detection color filters PCF1L, PCF1R, PCF2L and PCF2R among the grid patterns 15, and third image detection micro-lenses ML31 and ML32 and phase difference detection micro-lenses PML1 and PML2 on the image detection color filter CF3 and the phase difference detection color filters PCF1L, PCF1R, PCF2L and PCF2R. When the third image detection color filter CF3 and the second left phase difference detection color filter PCF2L have the same color G, grid patterns 15 therebetween may be omitted. That is, the boundary between the third image detection color filter CF3 and the second left phase difference detection color filter PCF2L may be virtually present. Furthermore, when the first left phase difference detection color filter PCF1L and the second right phase difference detection color filter PCF2R which are disposed adjacent to each other in the pixel block have the same color R or B, grid patterns 15 therebetween may be omitted. That is, the boundary between the first left phase difference detection color filter PCF1L and the second right phase difference detection color filter PCF2R may be virtually present. Since the first left phase difference detection color filter PCF1L and the first right phase difference detection color filter PCF1R have different colors, the grid pattern 15 may be disposed therebetween. Furthermore, since the second left phase difference detection color filter PCF2L and the second right phase difference detection color filter PCF2R also have different colors, the grid pattern 15 may be disposed therebetween.

When the first right phase difference detection color filter PCF1R and the adjacent third image detection color filter CF3 (not illustrated) have the same color G, grid patterns 15 therebetween may be omitted. That is, the boundary between the first right phase difference detection color filter PCF1R and the adjacent third image detection color filter CF3 (not illustrated) may be virtually present.

Figure 10A:
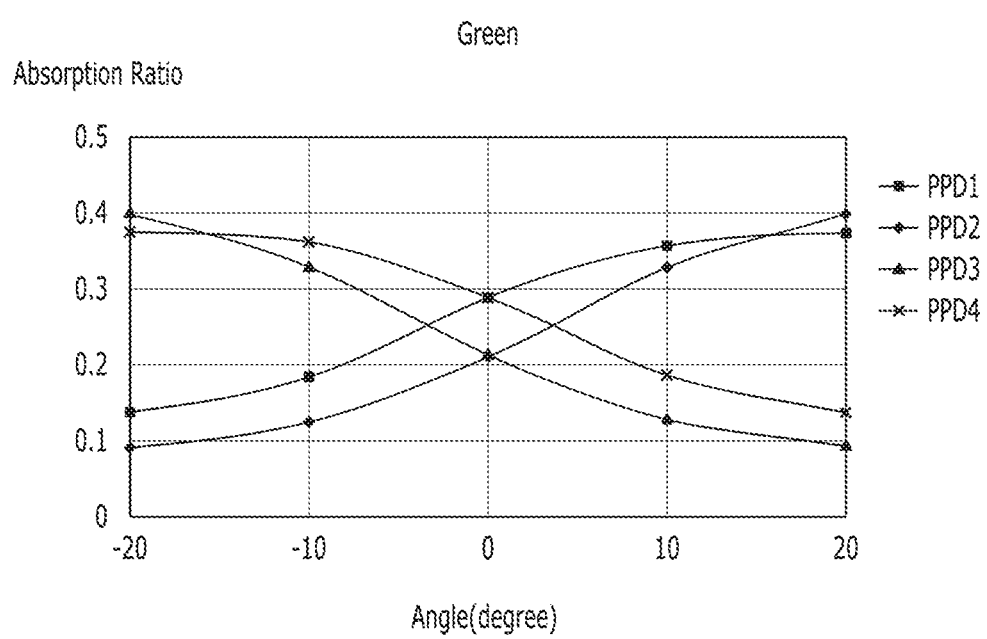
FIGS. 10A to 10C are graphs illustrating absorption ratios of lights received by the unit phase difference detection photodiodes depending on the angles at which the lights are incident.
Figure 10B:
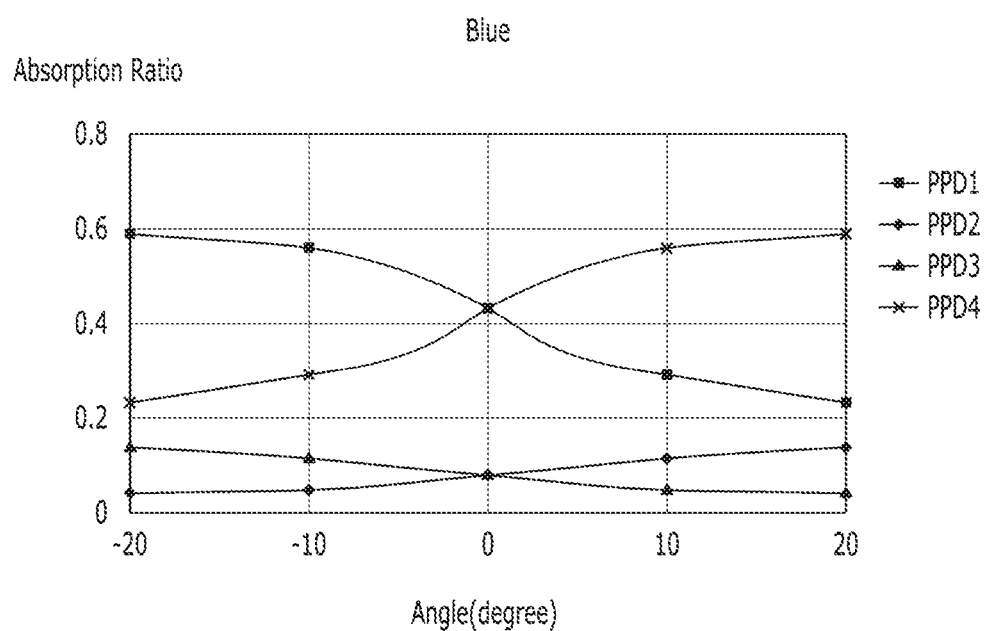
Figure 10C:
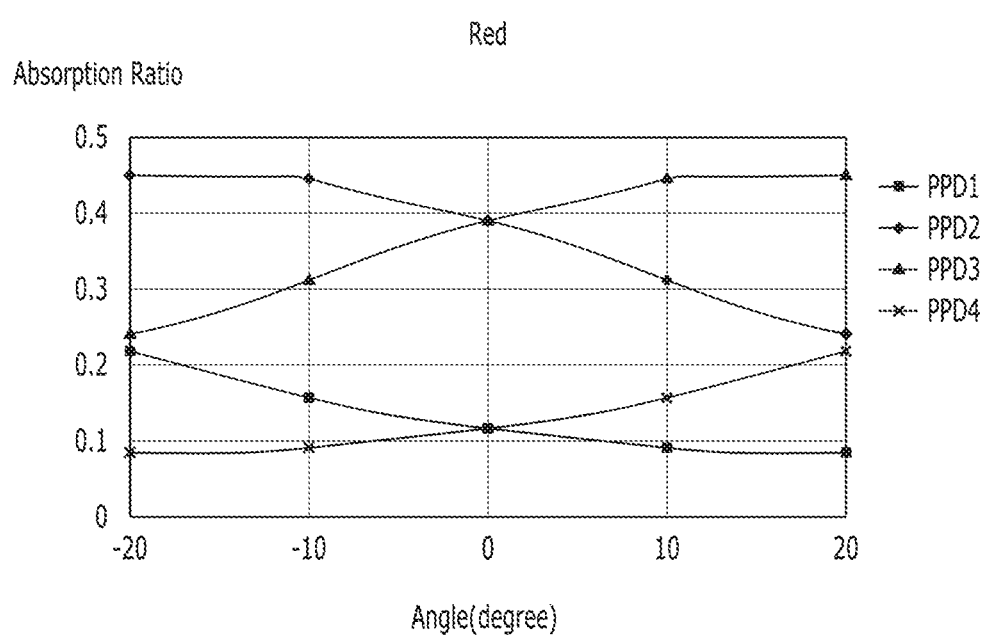

FIGS. 10A to 10C are graphs illustrating absorption ratios of lights accepted by the phase difference detection photodiodes PPD1 to PPD4, depending on the angles at which the lights are incident. Referring to FIGS. 7A, 9A and 9B, the case in which the first color C1 and the third color C3 are green, the second color C2 is blue, and the fourth color C4 is red will be described. Specifically, FIGS. 10A to 10C are graphs illustrating absorption ratios when green light, blue light and red light are incident on the phase difference detection color filter set PCFa illustrated in FIGS. 7A, 9A and 9B at various angles.

Referring to FIGS. 7A, 9A, 9B and 10A, when green light is incident on the unit phase difference detection photodiodes PPD1 to PPD4 (for example, the first and third colors C1 and C3 are green), the absorption ratios of the unit phase difference detection photodiodes PPD1 to PPD4 may be changed depending on light incidence angles. Specifically, when green light is incident with a negative (-) incidence angle or incident from the left top, the unit phase difference detection photodiodes PPD3 and PPD4 may have a relatively high absorption ratio because the unit phase difference detection color filters PCF3R and PCF4R capable of sensing the first and third colors C1 and C3 are positioned on the right thereof, and the unit phase difference detection photodiodes PPD1 and PPD2 may have a relatively low absorption ratio because the unit phase difference detection color filters PCF1L and PCF2L capable of sensing the first and third colors C1 and C3 are positioned on the left thereof (refer to the left half of the graph from −20 degrees to 0 degree). On the other hand, when green light is incident with a positive (+) incidence angle or incident from the right top, the unit phase difference detection photodiodes PPD1 and PPD2 may have a relatively high absorption ratio because the unit phase difference detection color filters PCF1L and PCF2L capable of sensing the first and third colors C1 and C3 are positioned on the left thereof, and the unit phase difference detection photodiodes PPD3 and PPD4 may have a relatively low absorption ratio because the unit phase difference detection color filters PCF3R and PCF4R capable of sensing the first and third colors C1 and C3 are positioned on the right thereof (refer to the right half of the graph from 0 degree to +20 degrees).

Referring to FIGS. 7A, 9A, 9B and 10B, when blue light is incident on the unit phase difference detection photodiodes PPD1 to PPD4 (for example, when the second color C2 is blue), the absorption ratios of the unit phase difference detection photodiodes PPD1 to PPD4 may be changed depending on light incidence angles. Specifically, when blue light is incident with a negative (−) incidence angle or incident from the left top, the unit phase difference detection photodiode PPD1 may have a relatively high absorption ratio because the color filter capable of sensing the second color C2 are positioned on the right thereof, and the unit phase difference detection photodiode PPD4 may have a relatively low absorption ratio because the color filter capable of sensing the second color C2 is positioned on the left thereof (refer to the left half of the graph from −20 degrees to 0 degree). On the other hand, when blue light is incident with a positive (+) incidence angle or incident from the right top, the unit phase difference detection photodiode PPD4 may have a relatively high absorption ratio because the color filter capable of sensing the second color C2 is positioned on the left thereof, and the unit phase difference detection photodiode PPD1 may have a relatively low absorption ratio because the color filter capable of sensing the second color C2 is positioned on the right thereof (refer to the right half of the graph from 0 degree to +20 degrees).

The unit phase difference detection photodiodes PPD2 and PPD3 which cannot sense the second color C2 have a relatively low absorption ratio difference that can be ignored.

Referring to FIGS. 7A, 9A, 9B and 10C, when red light is incident on the unit phase difference detection photodiodes PPD1 to PPD4 (for example, when the second color C4 is red), the absorption ratios of the unit phase difference detection photodiodes PPD1 to PPD4 may be changed depending on light incidence angles. Specifically, when red light is incident with a negative (−) incidence angle or incident from the left top, the unit phase difference detection photodiode PPD2 may have a relatively high absorption ratio because the color filter capable of sensing the fourth color C4 is positioned on the right thereof, and the unit phase difference detection photodiode PPD3 may have a relatively low absorption ratio because the color filter capable of sensing the fourth color C4 is positioned on the left thereof (refer to the left half of the graph from −20 degrees to 0 degree). On the other hand, when red light is incident with a positive (+) incidence angle or incident from the right top, the unit phase difference detection photodiode PPD3 may have a relatively high absorption ratio because the color filter capable of sensing the fourth color C4 is positioned on the left thereof, and the unit phase difference detection photodiode PPD2 may have a relatively low absorption ratio because the color filter capable of sensing the fourth color C4 is positioned on the right thereof (refer to the right half of the graph from 0 degree to +20 degrees). The unit phase difference detection photodiodes PPD2 and PPD3 which cannot sense the fourth color C4 have a relatively low absorption ratio difference that can be ignored.

Referring to FIGS. 10A to 10C, although each of the unit phase difference detection photodiodes PPD1 to PPD4 accepts two colors of light, an absorption ratio difference depending on incidence angles of the light may be sufficiently distinguished. That is, since the absorption ratios sufficiently change depending on the incidence angles of green light, blue light and red light, the auto-focus function can be implemented even though the photodiodes are not distinguished depending on the colors.

Figure 11A:
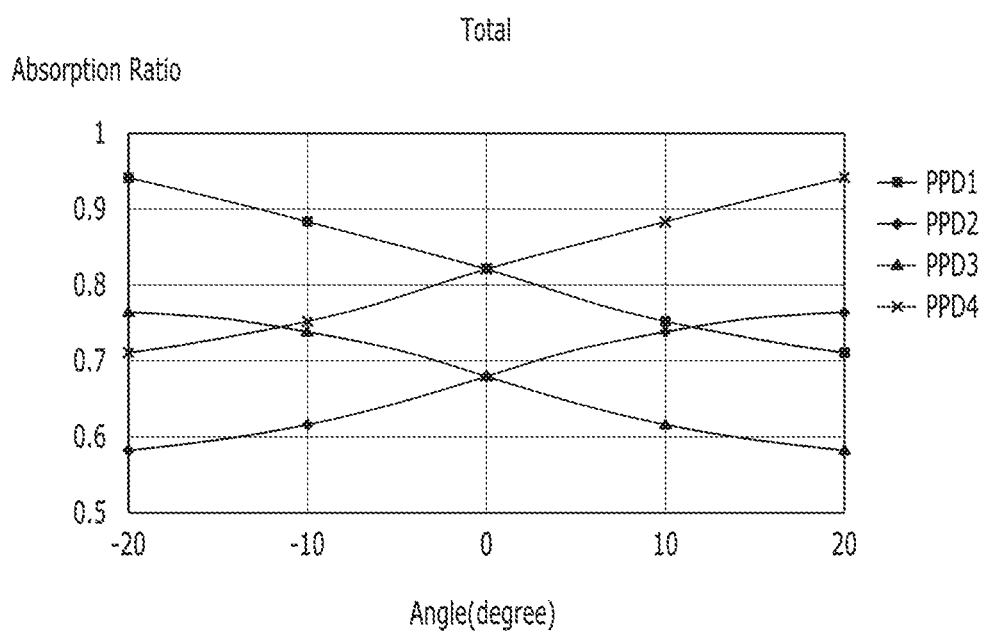
FIG. 11A is a graph illustrating differences among total absorption ratios of the unit phase difference detection photodiodes when first to fourth colors of light are all received.

FIG. 11A is a graph illustrating differences among total absorption ratios of the unit phase difference detection photodiodes PPD1 to PPD4 when lights of the first to fourth colors C1 to C4 are all received. For example, when visible light including all of the first to fourth colors C1 to C4 is incident at various incidence angles, absorption ratio differences may occur depending on the incidence angles. Values displayed on the graph may indicate values obtained by adding up the values displayed on FIGS. 10A to 10C. Referring to FIG. 11A, all of the unit phase difference detection photodiodes PPD1 to PPD4 may exhibit different absorption ratios depending on an incidence angle of visible light. Therefore, the auto-focus function depending on an incidence angle of light can be implemented.

Figure 11B:
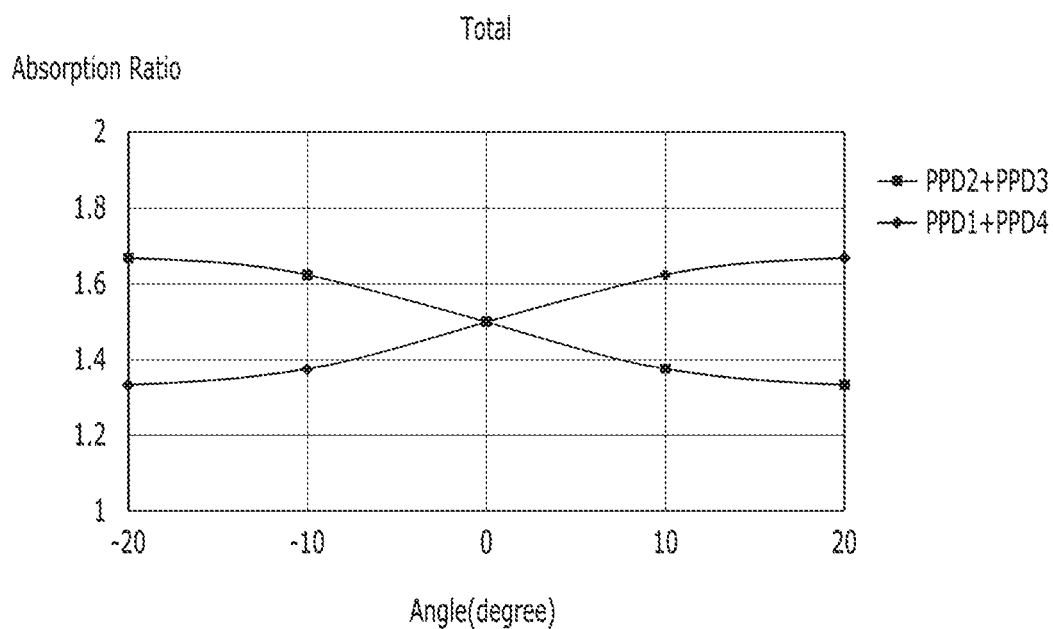
FIG. 11B is a graph illustrating results obtained by adding the absorption ratios of the second and third unit phase difference detection photodiodes PPD2 and PPD3 and adding the absorption ratios of the third and fourth unit phase difference detection photodiodes PPD1 and PPD4.

FIG. 11B is a graph illustrating results obtained by adding the absorption ratios of the second and third unit phase difference detection photodiodes PPD2 and PPD3 and adding the absorption ratios of the third and fourth unit phase difference detection photodiodes PPD1 and PPD4. Referring to FIG. 11A, the unit phase difference detection photodiodes PPD1 to PPD4 may be divided into two unit phase difference detection photodiode sets each having similar absorption ratio characteristics, and the absorption ratios of the unit phase difference detection photodiodes of each set may be added. Specifically, FIG. 11B is a graph illustrating results obtained by adding the absorption ratios of the second and third unit phase difference detection photodiodes PPD2 and PPD3 positioned on the left and adding the absorption ratios of the first and fourth unit phase difference detection photodiodes PPD1 and PPD4 positioned on the right. Referring to FIG. 11B, the addition of the absorption ratios of the second and third unit phase difference detection photodiodes PPD2 and PPD3 positioned on the left and the addition of the first and fourth unit phase difference detection photodiodes PPD1 and PPD4 positioned on the right show absorption ratio distributions depending on a light incidence angle, such that the auto-focus function can be sufficiently implemented.

In the image sensor 800 in accordance with the present embodiment, one photodiode is not assigned to each of the phase difference detection color filters, but two phase difference detection color filters may share one phase difference detection photodiode, in order to perform the auto-focus function. Therefore, a process margin for forming the phase difference detection photodiodes can be increased while the degree of integration is improved.

Figure 12:
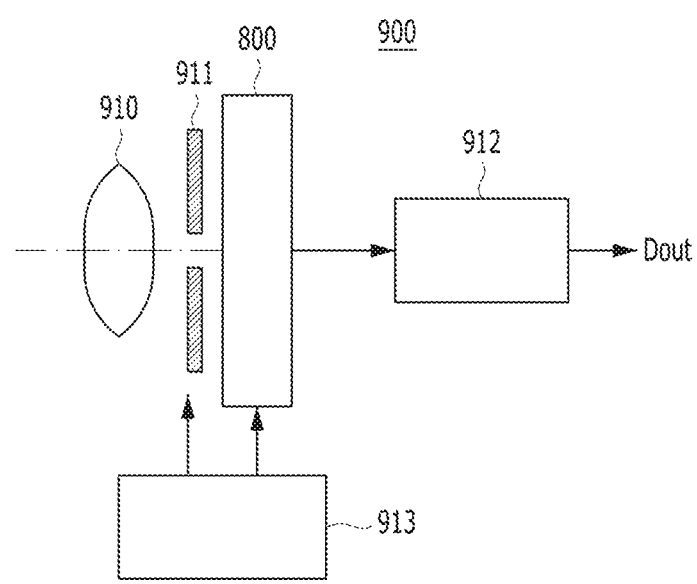
FIG. 12 is a diagram schematically illustrating an electronic device having an image sensor based on some embodiments of the disclosed technology.

FIG. 12 is a block diagram schematically illustrating a camera system 900 having an image sensor 800 based on some embodiments of the disclosed technology. Referring to FIG. 12, the camera system 900 having at least one of the various image sensors 800 in accordance with the present embodiments may take a still image or moving image. The camera system 900 may include a driver 913 and a signal processor 912. The driver 913 may control/drive an optical lens system 910, a shutter unit 911 and the image sensor 800. The camera system 900 may guide image light (incident light) Li from an object to the pixel array (refer to 810 of FIG. 1) of the image sensor 800. The optical lens system 900 may include a plurality of optical lenses. The shutter unit 911 may control a light irradiation period and shielding period for the image sensor 800. The driver 913 may control a transfer operation of the image sensor 800 and a shutter operation of the shutter unit 911. The signal processor 912 may perform various types of signal processing operations on a signal outputted from the image sensor 800. The processed image signal Dout may be stored in a storage medium such as a memory or outputted on a monitor or the like.

In some embodiments of the disclosed technology, image sensors with auto-focus function can bring good auto-focus performance by performing the phase difference detection using only a limited number of photodiodes. In some implementations, the phase difference detection can be performed using only one photodiode. Thus, the light reception efficiency may be improved, and a large number of pixels can be highly integrated with a low integration difficulty.

In some embodiments of the disclosed technology, image sensors with auto-focus function may be implemented by forming more than one color filter with different colors on top of a phase difference detection pixel. Unlike other image sensor designs where a phase difference detection photodiode is partially covered by an optically opaque pattern for auto-focus function, the image sensors based on some embodiments of the disclosed technology can be implemented without forming such optically opaque pattern to partially block incident light.

Although various embodiments have been described for illustrative purposes, it will be apparent to those skilled in the art that various changes and modifications may be made without departing from the spirit and scope of the invention as defined in the following claims.

What is claimed is:

1. An image sensor comprising:
   first to fourth phase difference detection photodiodes arranged in a matrix with rows and columns;
   a first left phase difference detection color filter and a first right phase difference detection color filter which overlap the first phase difference detection photodiode;
   a second left phase difference detection color filter and a second right phase difference detection color filter which overlap the second phase difference detection photodiode;
   a third left phase difference detection color filter and a third right phase difference detection color filter which overlap the third phase difference detection photodiode; and
   a fourth left phase difference detection color filter and a fourth right phase difference detection color filter which overlap the fourth phase difference detection photodiode,
   wherein:
   the first left phase difference detection color filter and the first right phase difference detection color filter have different colors;
   the second left phase difference detection color filter and the second right phase difference detection color filter have different colors;
   the third left phase difference detection color filter and the third right phase difference detection color filter have different colors; and
   the fourth left phase difference detection color filter and the fourth right phase difference detection color filter have different colors.

2. The image sensor of claim 1, further comprising:
   a first phase difference detection micro-lens overlapping the first left phase difference detection color filter and the first right phase difference detection color filter such that the first left phase difference detection color filter and the first right phase difference detection color filter share the first phase difference detection micro-lens;
   a second phase difference detection micro-lens overlapping the second left phase difference detection color filter and the second right phase difference detection color filter such that the second left phase difference detection color filter and the second right phase difference detection color filter share the second phase difference detection micro-lens;
   a third phase difference detection micro-lens overlapping the third left phase difference detection color filter and the third right phase difference detection color filter such that the third left phase difference detection color filter and the third right phase difference detection color filter share the third phase difference detection micro-lens; and
   a fourth phase difference detection micro-lens overlapping the fourth left phase difference detection color filter and the fourth right phase difference detection color filter such that the fourth left phase difference detection color filter and the fourth right phase difference detection color filter share the fourth phase difference detection micro-lens.

3. The image sensor of claim 1, wherein one of the first to fourth left phase difference detection color filters and one of the first to fourth right phase difference detection color filters transmit a first color,
   one of the first to fourth left phase difference detection color filters and one of the first to fourth right phase difference detection color filters transmit a second color,
   one of the first to fourth left phase difference detection color filters and one of the first to fourth right phase difference detection color filters transmit a third color, and
   one of the first to fourth left phase difference detection color filters and one of the first to fourth right phase difference detection color filters transmit a fourth color.

4. An image sensor comprising:
   first to third image detection color filter sets and a phase difference detection color filter set which are arranged in a matrix with rows and columns; and
   first to third image detection photodiode sets and a phase difference detection photodiode set, which overlap the first to third image detection color filter sets and the phase difference detection color filter set, respectively,
   wherein the phase difference detection color filter set comprises:
   a first phase difference detection color filter pair having a first left phase difference detection color filter and a first right phase difference detection color filter;
   a second phase difference detection color filter pair having a second left phase difference detection color filter and a second right phase difference detection color filter;
   a third phase difference detection color filter pair having a third left phase difference detection color filter and a third right phase difference detection color filter; and
   a fourth phase difference detection color filter pair having a fourth left phase difference detection color filter and a fourth right phase difference detection color filter,
   wherein the first left phase difference detection color filter and the first right phase difference detection color filter have different colors,
   the second left phase difference detection color filter and the second right phase difference detection color filter have different colors,
   the third left phase difference detection color filter and the third right phase difference detection color filter have different colors, and
   the fourth left phase difference detection color filter and the fourth right phase difference detection color filter have different colors.

5. The image sensor of claim 4, wherein the first phase difference detection color filter pair and the second phase difference detection color filter pair are adjacent to each other in a first direction,
   the third phase difference detection color filter pair and the fourth phase difference detection color filter pair are adjacent to each other in the first direction,
   the first phase difference detection color filter pair and the fourth phase difference detection color filter pair are adjacent to each other in a second direction perpendicular to the first direction, and
   the second phase difference detection color filter pair and the third phase difference detection color filter pair are adjacent to each other in the second direction.

6. The image sensor of claim 5, wherein the second left phase difference detection color filter, the third left phase difference detection color filter, and the third image detection color filter set adjacent thereto have the same color.

7. The image sensor of claim 5, wherein the first left phase difference detection color filter and the second right phase difference detection color filter have the same color.

8. The image sensor of claim 5, wherein the first left phase difference detection color filter and the fourth right phase difference detection color filter have the same color.

9. The image sensor of claim 5, wherein the third right phase difference detection color filter and the fourth left phase difference detection color filter have the same color.

10. An image sensor comprising a plurality of groups of pixels, each group of pixels including:
first to third image detection color filter sets and a phase difference detection color filter set, which are arranged in a matrix with rows and columns;
first to third image detection photodiode sets overlapping the first to third image detection color filter sets, respectively; and
a phase difference detection photodiode set overlapping the phase difference detection color filter set,
wherein the phase difference detection color filter set comprises first to fourth phase difference detection color filter pairs arranged in a matrix with rows and columns,
wherein the first to fourth phase difference detection color filter pairs comprise first to fourth left phase difference detection color filters positioned on the left of each of the first to fourth phase difference detection color filter pairs and first to fourth right phase difference detection color filters positioned on the right of each of the first to fourth phase difference detection color filter pairs, respectively, and
wherein the first image detection photodiode set comprises four first unit image detection photodiodes,
the second image detection photodiode set comprises four second unit image detection photodiodes, and
the third image detection photodiode set comprises four third unit image detection photodiodes.

11. The image sensor of claim 10, wherein each of the first to third image detection color filter sets comprises one merged color filter,
the first unit image detection photodiodes of the first image detection photodiode set share the merged color filter of the first image detection color filter set,
the second unit image detection photodiodes of the second image detection photodiode set share the merged color filter of the second image detection color filter set, and
the third unit image detection photodiodes of the third image detection photodiode set share the merged color filter of the third image detection color filter set.

12. The image sensor of claim 10, wherein the phase difference detection photodiode set comprises first to fourth phase difference detection photodiodes arranged in a matrix with rows and columns, and
the first to fourth phase difference detection color filter pairs overlap the first to fourth phase difference detection photodiodes, respectively.

13. The image sensor of claim 12, wherein the first left phase difference detection color filter and the first right phase difference detection color filter share the first phase difference detection photodiode,
the second left phase difference detection color filter and the second right phase difference detection color filter share the second phase difference detection photodiode,
the third left phase difference detection color filter and the third right phase difference detection color filter share the third phase difference detection photodiode, and
the fourth left phase difference detection color filter and the fourth right phase difference detection color filter share the fourth phase difference detection photodiode.

14. The image sensor of claim 10, wherein the first to fourth left phase difference detection color filters comprise two green color filters, one blue color filter and one red color filter.

15. The image sensor of claim 14, wherein the first to fourth right phase difference detection color filters comprise two green color filters, one blue color filter and one red color filter.

16. The image sensor of claim 10, further comprising:
first to third image detection micro-lens sets overlapping the first to third image detection color filter sets, respectively; and
a phase difference detection micro-lens set overlapping the phase difference detection color filter set,
wherein the first image detection micro-lens set comprises four first unit image detection micro-lenses,
the second image detection micro-lens set comprises four second unit image detection micro-lenses, and
the third image detection micro-lens set comprises four third unit image detection micro-lenses.

17. The image sensor of claim 16, wherein the phase difference detection micro-lens set comprises first to fourth phase difference detection micro-lenses arranged in a matrix with rows and columns, and
the first to fourth phase difference detection color filter pairs overlap the first to fourth phase difference detection micro-lenses, respectively.

18. The image sensor of claim 17, wherein the first left phase difference detection color filter and the first right phase difference detection color filter share the first phase difference detection micro-lens,
the second left phase difference detection color filter and the second right phase difference detection color filter share the second phase difference detection micro-lens,
the third left phase difference detection color filter and the third right phase difference detection color filter share the third phase difference detection micro-lens, and
the fourth left phase difference detection color filter and the fourth right phase difference detection color filter share the fourth phase difference detection micro-lens.

* * * * *

UNITED STATES PATENT AND TRADEMARK OFFICE
CERTIFICATE OF CORRECTION

Page 1 of 1

PATENT NO. : 11,158,660 B2
APPLICATION NO. : 16/540419
DATED : October 26, 2021
INVENTOR(S) : Kyoung-In Lee et al.

It is certified that error appears in the above-identified patent and that said Letters Patent is hereby corrected as shown below:

On the Title Page

Item (73), in Column 1, for "Assignee", delete "SK hynix Inc., Icheon-si (KR)" and insert -- SK hynix Inc., Icheon-si (KR); Dong-A University Research Foundation For Industry-Academy Cooperation, Busan (KR) --, therefor.

Signed and Sealed this
Sixth Day of December, 2022

Katherine Kelly Vidal
*Director of the United States Patent and Trademark Office*